(12) United States Patent
Grüning-Von Schwerin

(10) Patent No.: US 7,279,742 B2
(45) Date of Patent: Oct. 9, 2007

(54) TRANSISTOR STRUCTURE WITH A CURVED CHANNEL, MEMORY CELL AND MEMORY CELL ARRAY FOR DRAMS, AND METHODS FOR FABRICATING A DRAM

(75) Inventor: Ulrike Grüning-Von Schwerin, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/024,935

(22) Filed: Dec. 30, 2004

(65) Prior Publication Data

US 2005/0151206 A1 Jul. 14, 2005

(30) Foreign Application Priority Data

Dec. 30, 2003 (DE) ................. 103 61 695

(51) Int. Cl.
*H01L 27/108* (2006.01)
*H01L 29/94* (2006.01)

(52) U.S. Cl. .............. 257/329; 257/296; 257/390

(58) Field of Classification Search ........... 257/296, 257/329, 390
See application file for complete search history.

(56) References Cited

U.S. PATENT DOCUMENTS

| | | | |
|---|---|---|---|
| 5,920,088 A * | 7/1999 | Augusto | 257/192 |
| 5,945,707 A | 8/1999 | Bronner et al. | |
| 6,977,404 B2 * | 12/2005 | Katsumata et al. | 257/301 |
| 2001/0010957 A1 * | 8/2001 | Forbes et al. | 438/248 |
| 2005/0127421 A1 * | 6/2005 | Seidl et al. | 257/300 |

* cited by examiner

Primary Examiner—Sara Crane
Assistant Examiner—Colleen Matthews
(74) Attorney, Agent, or Firm—Edell, Shapiro & Finnan, LLC

(57) ABSTRACT

A transistor structure having source/drain regions arranged in a horizontal plane along an x axis has a recess structure, which separates the two source/drain regions from one another and increases the effective channel length $L_{eff}$ of the transistor structure. A vertical gate electrode with respect to the horizontal plane extends along the x axis and in this case encloses an active zone of the transistor structure from two sides or completely. The effective channel width $W_{eff}$ is dependent on the depth to which the gate electrode is formed. A memory cell having a selection transistor in accordance with the transistor structure has both a low leakage current and a good switching behavior. By a suitable integration concept, the transistor structure is integrated into a memory cell array of a DRAM having hole trench capacitors or stacked capacitors.

27 Claims, 21 Drawing Sheets

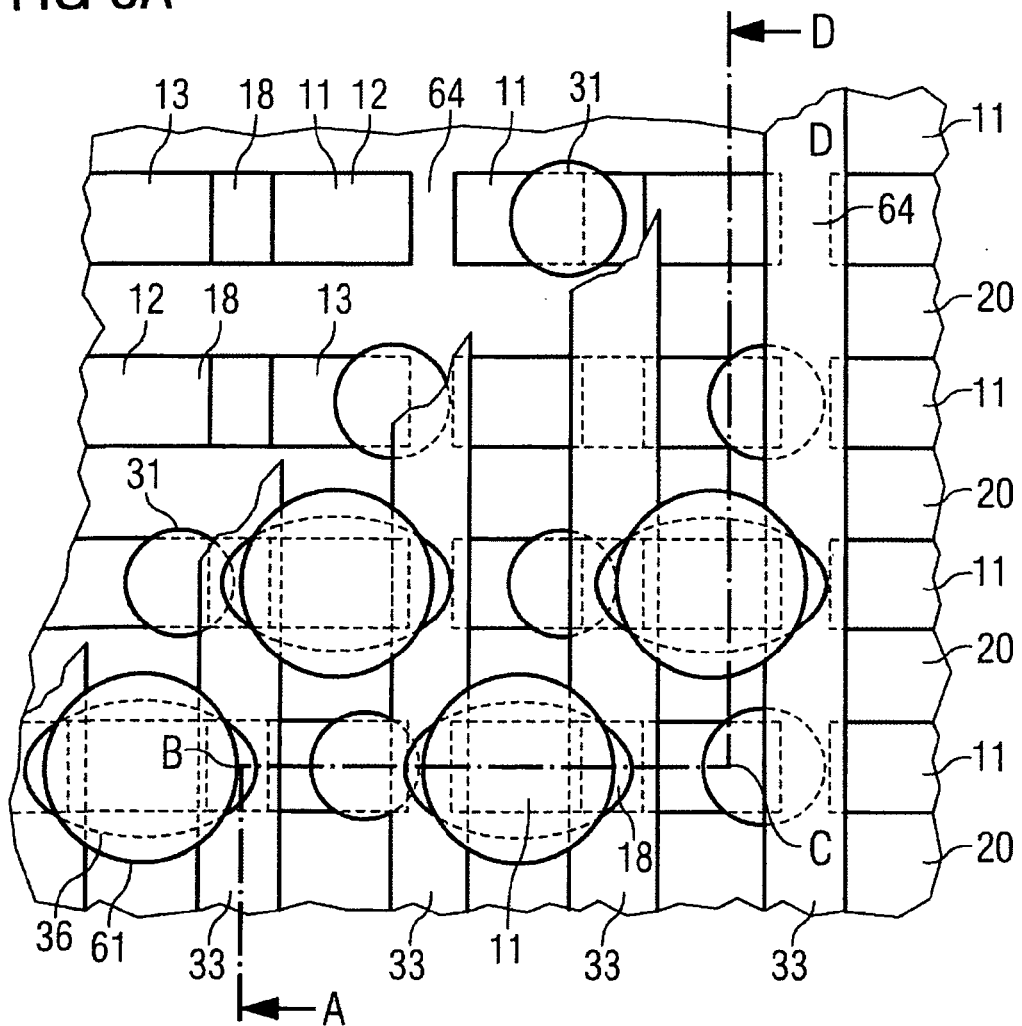

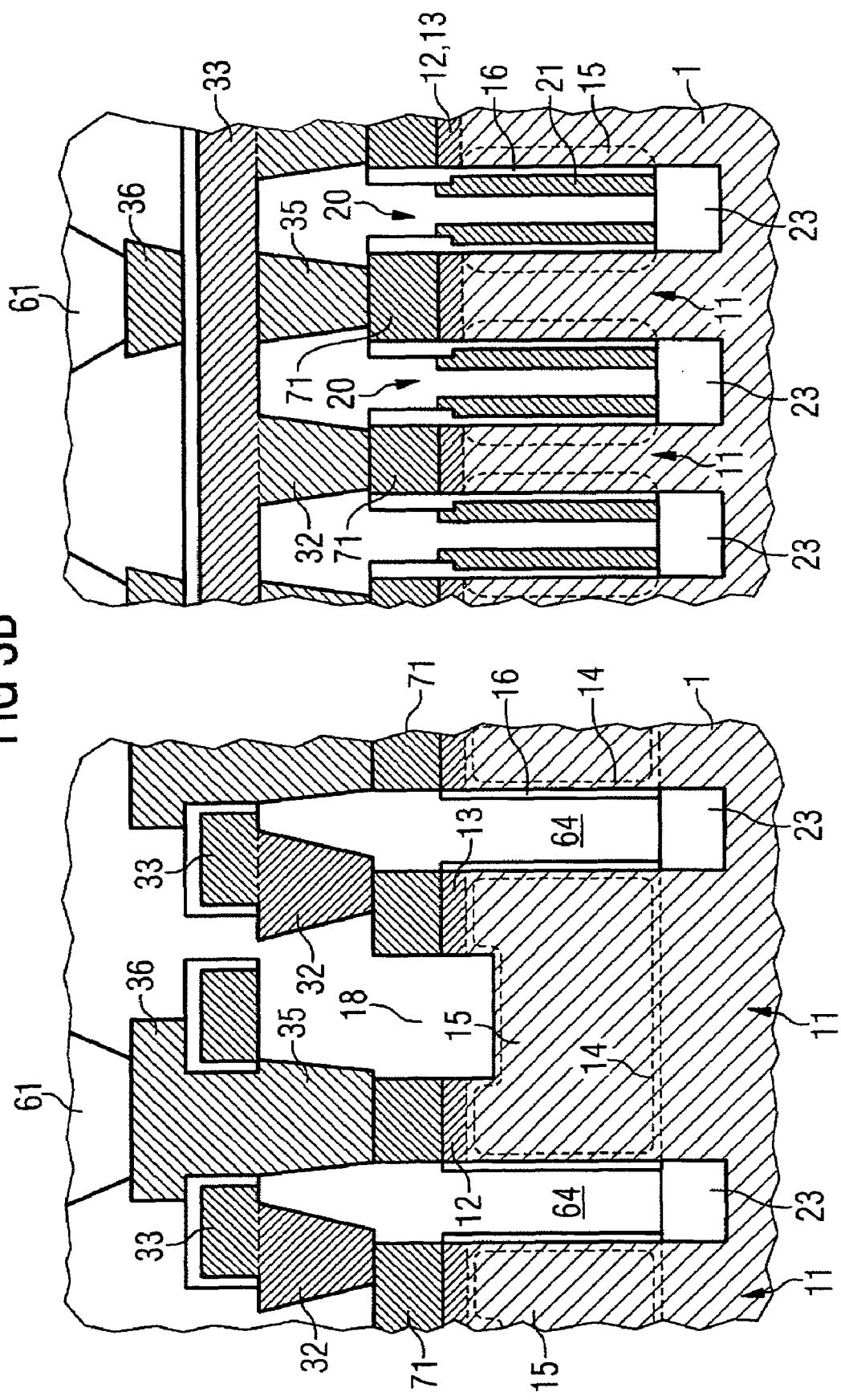

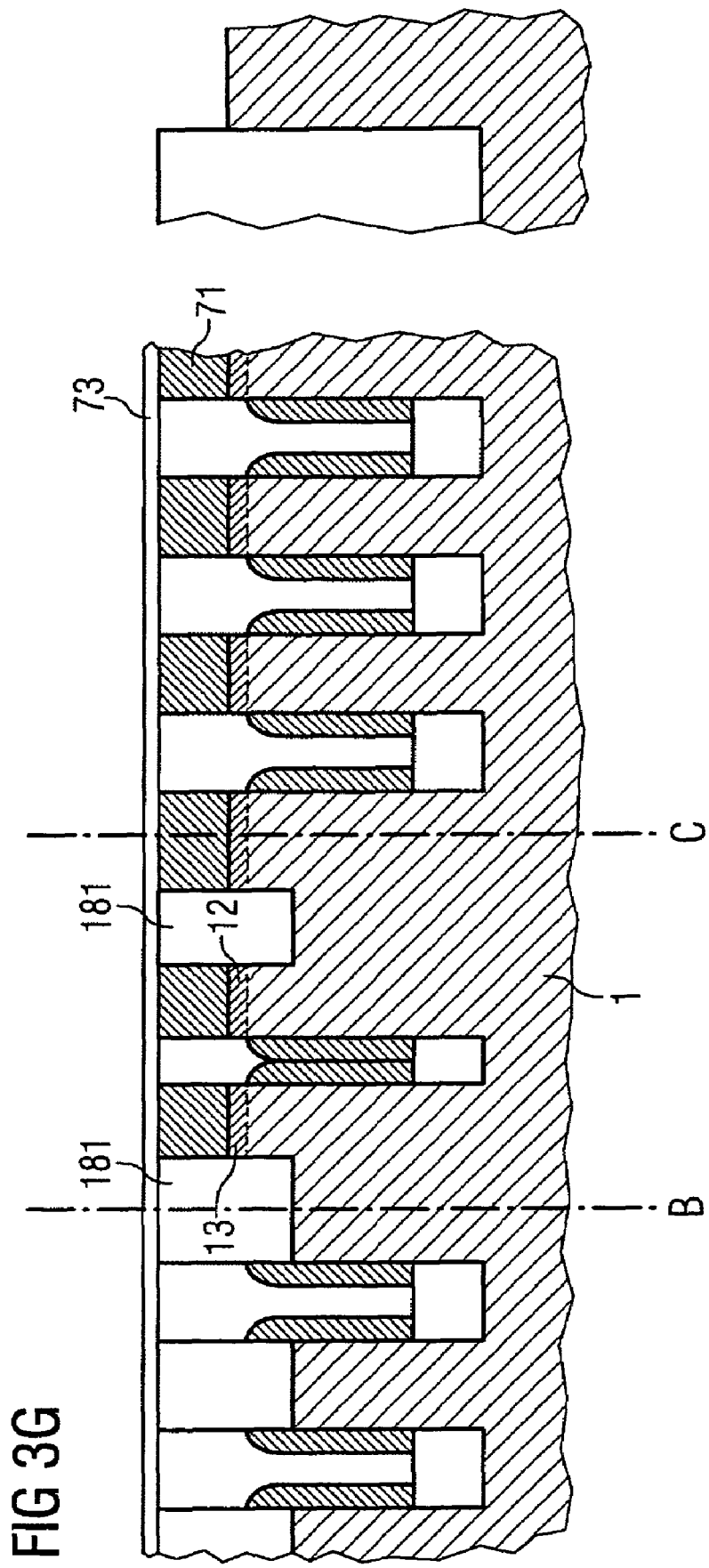

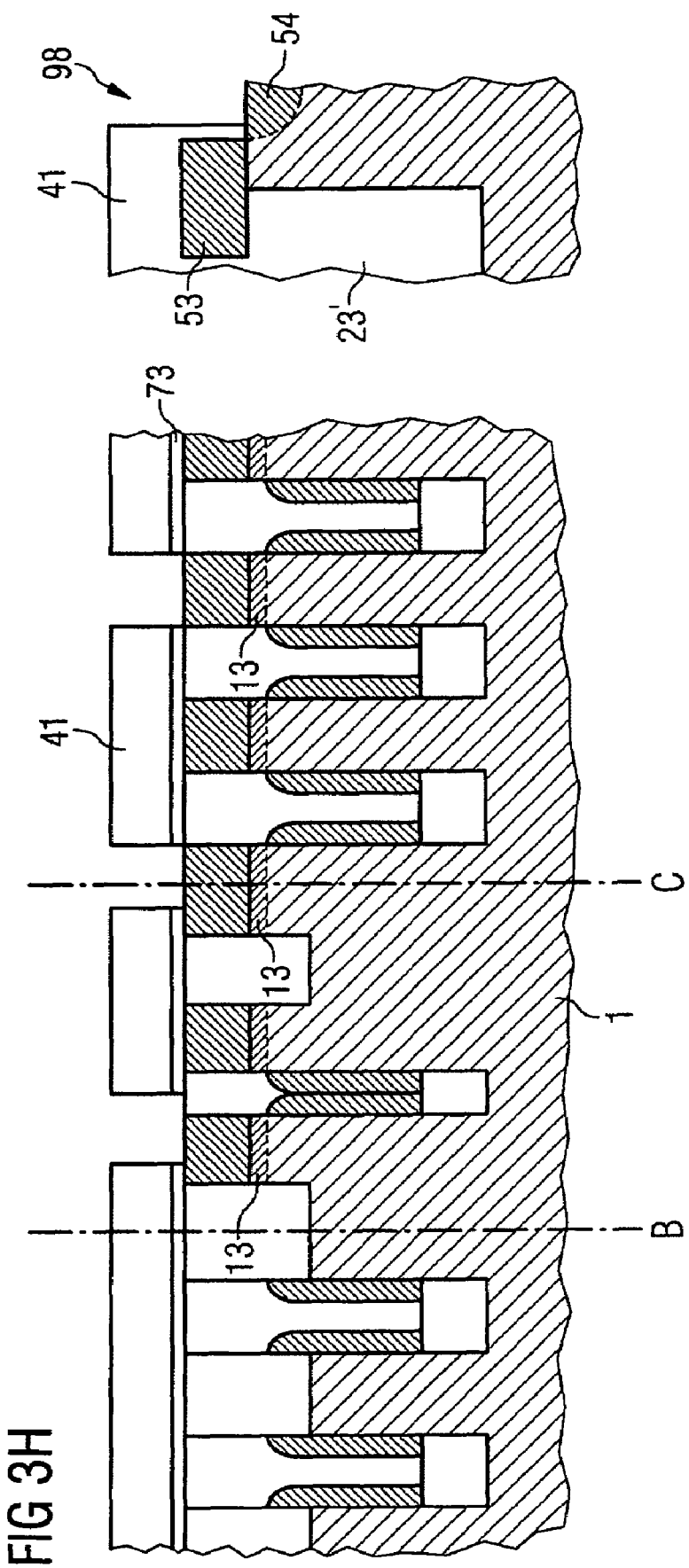

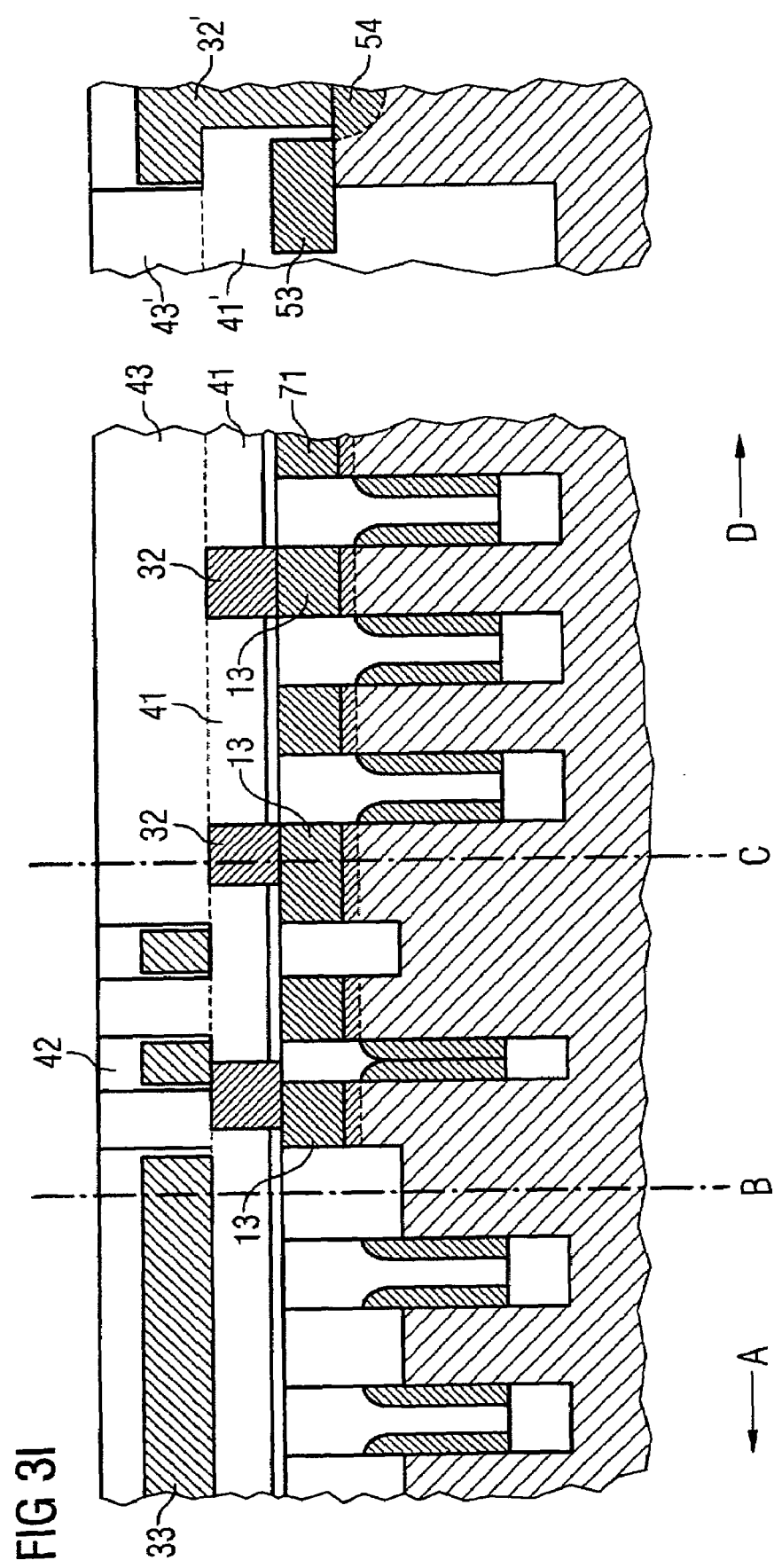

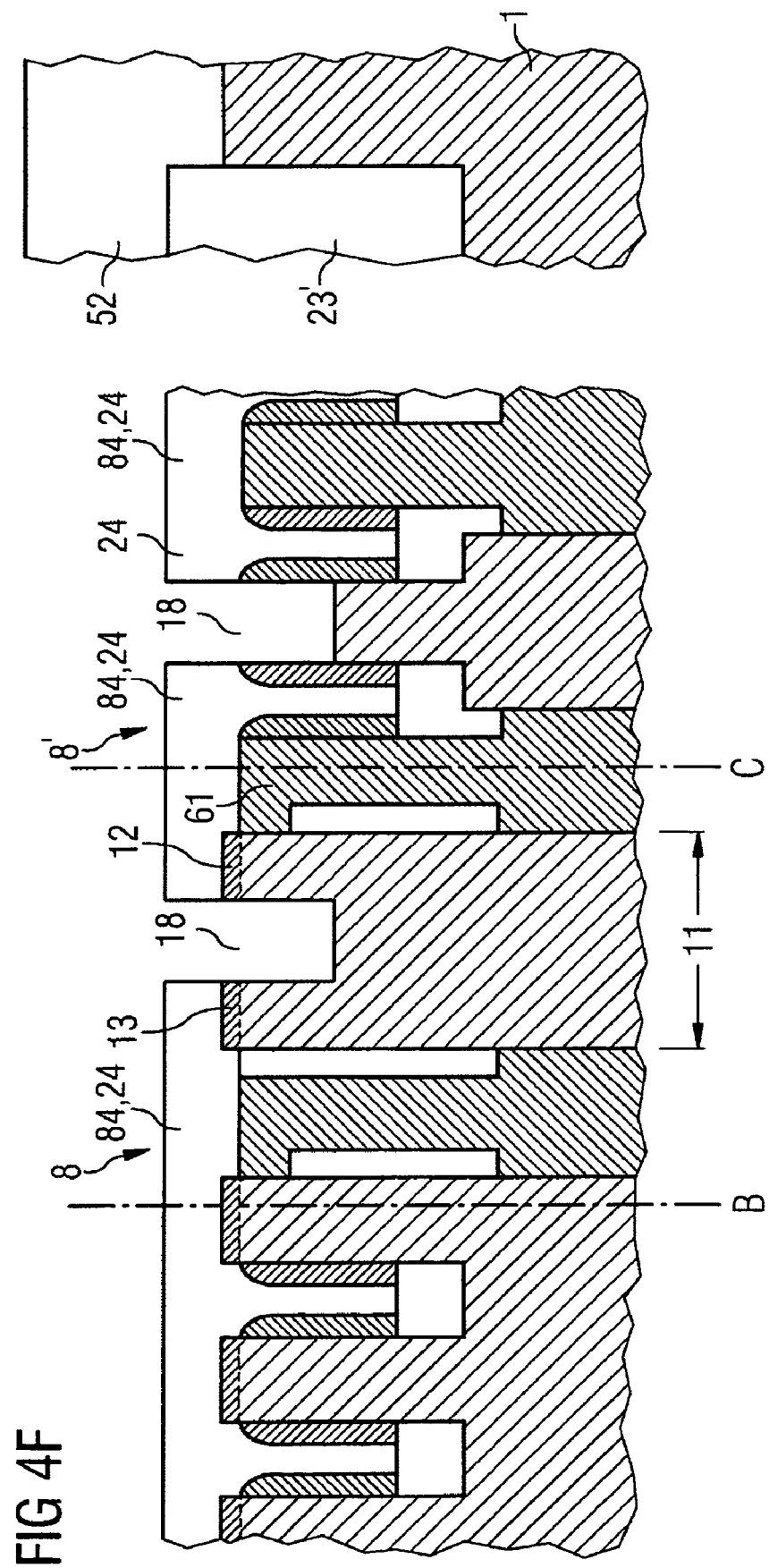

TRANSISTOR STRUCTURE WITH A CURVED CHANNEL, MEMORY CELL AND MEMORY CELL ARRAY FOR DRAMS, AND METHODS FOR FABRICATING A DRAM

CROSS REFERENCE TO RELATED APPLICATIONS

This application claims priority under 35 U.S.C. §119 to German Application No. DE 103 61 695.0, filed on Dec. 30, 2003, and titled "Transistor Structure with a Curved Channel Memory Cell and Memory Cell Array for DRAMs, and Methods for Fabricating a DRAM," the entire contents of which are hereby incorporated by reference.

FIELD OF THE INVENTION

The invention relates to a transistor structure having two source/drain regions, which are formed in a semiconductor substrate, are arranged in a horizontal plane along an x axis with respect to a substrate surface of the semiconductor substrate and are spaced apart from one another by a recess structure, a surface contour of an active zone being predefined by a contour of an auxiliary area composed of the cross sections of the source/drain regions and also the recess structure in the horizontal plane and a sidewall of the active zone being predefined by vertical projection lines of the surface contour into the semiconductor substrate, and the formation of a conductive channel between the two source/drain regions being controllable by a potential at a gate electrode.

BACKGROUND

Memory cells of dynamic random access memories (DRAMs) are usually provided with a respective storage capacitor for storing electrical charge and a selection transistor for addressing the storage capacitor. In this case, a lower limit results for a channel length of the selection transistor, below which lower limit the insulation properties of the selection transistor are inadequate in the turned-off, non-addressed state of the memory cell. The lower limit for an effective channel length $L_{eff}$ limits the scalability of conventional planar transistor cells (PTCs) with a selection transistor oriented horizontally with respect to a substrate surface of a semiconductor substrate.

The functionality of a memory cell is furthermore determined by the resistance of the selection transistor in the turned-on state given addressing of the memory cell. With advancing miniaturization of the structures, an effective channel width $W_{eff}$ of the selection transistor is being increasingly reduced and the charging/discharging current $I_{on}$ of the memory cell is disadvantageously limited.

Therefore, fin field-effect transistors (FinFETs) are known, as are described for example in "Fabrication of Body-Tied FinFETs (omega MOSFETs) using Bulk Si Wafers," Park et al.; in "2003 Symposium on VLSI Technology Digest of Technical Papers." Between two source/drain regions of a transistor cell that are arranged in planar fashion, a semiconductor substrate is etched back by a recess step and a fin formed by the semiconductor substrate is shaped between the two source/drain regions in the process. A gate electrode structure envelops the fin from at least two sides. The effective channel length $L_{eff}$ is determined by the length of the fin in accordance with a minimum feature size F governed by the production technology. The effective channel width $W_{eff}$ is determined from the height of the fin, or the depth to which the recess step is carried out.

The effective channel length $L_{eff}$ is linked to the minimum feature size F and limits the scaling potential of the finFET with regard to the leakage current or the insulator properties in the off state. The switching threshold of the finFET depends greatly on production parameters. The fabrication of a fin field-effect transistor as selection transistor of a memory cell with a hole trench capacitor proves to be complex.

Arrangements with vertical transistor cells (VTCs) are known for memory cells with a hole trench capacitor. The source/drain regions of the selection transistor are essentially arranged vertically one above the other in the semiconductor substrate. A channel controlled by a gate electrode of the selection transistor is formed perpendicular to the cell array plane or substrate surface of the semiconductor substrate. The minimum channel width $W_{eff}$ results in accordance with the minimum feature size F. The channel length $L_{eff}$ is dependent on the depth at which the lower source/drain region or a lower edge of the gate electrode is formed.

Disadvantages of the vertical transistor cell are the difficult integration in memory cells having stacked capacitors, the increase in the aspect ratio of a hole trench for forming the memory cell in the case of integration in memory cells having hole trench capacitors, the restricted switch-on/switch-off current $I_{on}$ and also the parasitic action of the gate electrode of a selection transistor on adjacent memory cells.

A vertical memory cell with a vertical transistor structure in which the gate electrode completely encloses a body region arranged between the two source/drain regions is described in "Fully Depleted Surrounding Gate Transistor (SGT) for 70 nm DRAM and Beyond"; Goebel et al. A fin is formed by etching back a semiconductor substrate. A first source/drain region is formed by outdiffusion from an adjacent structure in the base region of the fin. A second source/drain region is provided at the upper edge of the fin. The gate electrode is arranged along the four sidewalls of the fin. The effective channel length $L_{eff}$ results from the depth of etching back for the fin. The effective channel width $W_{eff}$ corresponds to the contour of the fin, at least one side length resulting in a manner dependent on the minimum feature size F. The total effective channel width correspondingly amounts to 2F to 3F. Like the vertical transistor cell, the transistor cell with a surrounding gate electrode, too, can only be integrated in a complex manner in memory cells having stacked capacitors. The high aspect ratios established in the course of processing and the resultant restrictions in the processing and with regard to the storage capacitor are furthermore disadvantageous.

A field-effect transistor with a curved channel is described in "The Breakthrough in Data Retention time of DRAM using Recess-Channel-Array Transistor (RCAT) for 88 nm Feature Size and Beyond"; Kim et al.; in "2003 Symposium on VLSI Technology Digest of Technical Papers." The two source/drain regions of the field-effect transistor are arranged in a horizontal plane. The gate electrode is arranged in a recess trench introduced into the semiconductor substrate between the two source/drain regions of the transistor. The effective channel length $L_{eff}$ results from the distance between the two source/drain regions and also the depth to which the recess trench provided between the two source/drain regions is introduced into the semiconductor substrate. The effective channel width $W_{eff}$ corresponds to the minimum feature size F.

The continuing restriction of the effective channel width disadvantageously limits the switch-on/switch-off current.

In the case of integration of recess channel FETs in memory cells with a high packing density, the alignment of the gate electrodes with respect to the recess trenches proves to be complex, for instance if both are respectively patterned in the course of a photolithographic method. In contrast to finFET or SGT transistor cells, the active zone is not shielded from the adjacent memory cells by the gate electrode. A parasitic punchthrough of the potential of a gate electrode to the adjacent transistor cells occurs.

An arrangement for memory cells having hole trench capacitors and selection transistors having a gate electrode grooved into the semiconductor substrate (grooved gate) is described in U.S. Pat. No. 5,945,707 (Bronner et al.) and is explained below with reference to FIG. 1.

In accordance with FIG. 1, storage capacitors 6 are formed as hole trench capacitors 8 in a semiconductor substrate 1 below a substrate surface 10. A hole trench capacitor 8 comprises a storage electrode 61 arranged in the interior of a hole trench and a counterelectrode 63 formed as a doped zone in a section of the semiconductor substrate 1 that surrounds a lower section of the storage electrode 61. A capacitor dielectric 62 is provided between the storage electrode 61 and the counterelectrode 63. In an upper section of the hole trench capacitor 6, the storage electrode 61 is insulated from the semiconductor substrate 1 by a collar insulator structure 81.

An active zone 11 with two selection transistors 9, 9' is formed by the semiconductor substrate 1 between in each case two adjacent capacitor structures 6. The source/drain regions 12, 13 of the selection transistors 9, 9' are in each case doped sections of the active zone 11. A respective first source/drain region 12 adjoins the storage electrode 61 of a storage capacitor 6 in the region of a contact window 82. The second source/drain region 13 is connected via a bit contact 31 to a-data line 33 arranged above the substrate surface 10. The gate electrode 2 comprises a highly conductive section 2a. The gate electrodes of selection transistors that are adjacent in the direction perpendicular to the cross-sectional plane are connected to one another and form addressing lines. The addressing lines are enclosed by a gate stack insulator structure 95 and insulated from the data line 33 formed thereabove by an interlayer dielectric 41.

Between the two source/drain regions 12, 13 of the selection transistors 9, 9', a recess trench 18 is introduced in each case from the substrate surface 10. The recess trench 18 is filled with the material of the gate electrode 2. A channel region 15 of the selection transistor 9, 9' extends in the semiconductor substrate 1 along the sidewalls and the bottom of the recess trench 18. A gate dielectric 16 is provided between the gate electrode 2 and the semiconductor substrate 1. The recess trench 18 lengthens the effective channel length $L_{eff}$ with regard to a cell current 96 compared with a conventional planar transistor structure.

The patterning of the addressing lines is carried out in a manner aligned with the recess trenches 18 introduced beforehand and the patterning of the recess trenches 18 is carried out in a manner aligned with the hole trenches of the hole trench capacitors 8. The effective channel width $W_{eff}$ is disadvantageously predefined, in the direction perpendicular to the cross-sectional plane, by the distance with respect to the memory cells that are adjacent in this direction.

SUMMARY

The invention provides a transistor structure which has an improved switch-on and switch-off behavior given the same area requirement in relation to a comparable conventional transistor structure. The invention further encompasses a memory cell with an improved switch-on and switch-off behavior and also a memory cell array and methods for fabricating a DRAM.

A transistor structure with a curved channel has two source/drain regions, which are formed in a semiconductor substrate, are arranged in a horizontal plane with respect to a substrate surface of the semiconductor substrate along an x axis, and are spaced apart from one another by a recess structure. A surface contour of an active zone of the transistor structure is predefined by the outer contours of the source/drain regions and also the recess structure in the horizontal plane. Vertical projection lines of the surface contour into the semiconductor substrate define an active zone of the transistor structure that is delimited by the vertical projection lines. A sidewall of the active zone is predefined by the vertical projection lines of the surface contour.

According to the invention, the gate electrode is provided along the sidewall of the active zone. The gate electrode has at least one section that extends in the x axis between the two source/drain regions and in the vertical direction from the lower edges of the source/drain regions to beyond a lower edge of the recess structure.

In contrast to conventional transistor structures with a curved channel, in the case of the transistor structure according to the invention, the effective channel width is determined largely independently of the known feature size F and results from the depth to which the gate electrodes are formed at the sidewalls of the active zone of the transistor structure.

The gate electrode advantageously has a second section situated symmetrically opposite to the first section at the recess structure. The active zone is protected against interfering influences (cross-gating effects) and the effective channel width is doubled.

In a particularly preferred manner, the active zone of the transistor structure, along the sidewall, is completely surrounded by the gate electrode. The active zone is largely shielded against influences of adjacent transistor structures and a maximum effective channel width is obtained.

A high packing density of transistor structures according to the invention can advantageously be obtained by providing the active zone with two sidewall sections parallel to the x axis. The active zones of a plurality of transistor structures can then be arranged next to one another in rows in a simple manner.

The active zone is preferably formed in a fin of the semiconductor substrate that is provided between two parallel gate electrode trenches. A gate dielectric is provided between the active zone and the gate electrode. The gate electrode is arranged in the gate electrode trenches in a manner spaced apart from the active zone by the gate dielectric.

The invention's transistor structure with a curved channel (curved double gate/surrounded gate FET, CFET) leads to a memory cell according to the invention having a storage capacitor for storing electrical charge and a selection transistor connected in series with the storage capacitor by a source/drain path and having a curved channel. The selection transistor has a first source/drain region connected to a storage electrode of the storage capacitor. A second source/drain region of the selection transistor is connected to a data line for transferring electrical charge to be stored or stored electrically charge. A gate electrode of the selection transistor is connected to an addressing line for the control of the memory cell. An effective channel length $L_{eff}$ of the selection transistor is determined by the depth of a recess structure introduced between the two source/drain regions.

The gate electrode of the selection transistor is formed in accordance with the above-described transistor structure according to the invention and an effective channel width $W_{eff}$ of the selection transistor is thereby increased. The increased effective channel width $W_{eff}$ improves the switching behavior of the memory cell. As a result of the lower resistance in the turned-on state of the selection transistor, a faster access to the memory cell is possible with a reduced power loss. The punchthrough from the gate electrode arranged at least on two sides to the active zone or substrate situated in between is improved. The shielding effect against cross-gating effects is increased.

The memory cells according to the invention can advantageously be ordered to form a novel memory cell array. The memory cell array then has a plurality of memory cells arranged in cell rows and cell columns. Each memory cell comprises a storage capacitor for storing electrical charge and a selection transistor with a curved channel that is connected in series with the storage capacitor by a source/drain path. A first source/drain region of the selection transistor is connected to a storage electrode of the storage capacitor. A second source/drain region of the selection transistor is connected to a data line for transferring electrical charge to be stored and also electrical charge that has formerly been installed. A gate electrode of the selection transistor is connected to an addressing line for the control of the memory cell. An effective channel length $L_{eff}$ of the selection transistor is determined by the depth of a recess structure fitted between the two source/drain regions.

The gate electrodes of the selection transistors are in each case formed in accordance with the gate electrode of the transistor structure according to the invention, so that an effective channel width $W_{eff}$ of the selection transistors is in each case increased. The gate electrodes of selection transistors of memory cells that are respectively arranged in a cell row are connected to one another and form the addressing lines for the control of the memory cells.

Compared with conventional memory cell arrays having selection transistors with a curved channel, for instance that in U.S. Pat. No. 5,945,707, cited in the background, the introduction of recess trenches for the recess structures, on the one hand, and the formation of the gate electrodes, on the other hand, are advantageously decoupled from one another. A difficulty that results from the fact that, by way of example, a first mask for introducing the recess trenches and a second mask for patterning the gate electrodes have to be aligned relative to one another is obviated.

The storage capacitors and the selection transistors of the memory cell array are advantageously arranged in the manner of a chessboard pattern, the selection transistors being assigned to first arrays that are in each case diagonally adjacent to one another and the storage capacitors being assigned in each case to second arrays that are situated in between. In a first preferred embodiment of the memory cell array according to the invention, the storage capacitors are formed as stacked capacitors above a substrate surface of the semiconductor substrate and, in a second preferred embodiment of the memory cell array according to the invention, the storage capacitors are formed as hole trench capacitors, the hole trench capacitors in each case being formed in a manner oriented to a hole trench introduced into the semiconductor substrate.

If the storage capacitors are provided as stacked capacitors, then the active zones are preferably formed with a rectangular surface contour and in each case separated from one another within a cell row by narrow cell insulator trenches. Adjacent cell rows are in each case isolated from one another by wide word line trenches. The recess structures are provided parallel to the cell insulator trenches and approximately equidistantly from in each case two adjacent cell insulator trenches. The addressing lines are arranged in the word line trenches the data lines are led above the substrate surface in each case essentially over the recess structures and also over the cell insulator trenches. This advantageously results in a small area requirement of the memory cells, comparatively minor requirements being made of the alignment of required masks relative to one another.

The cell insulator trenches and the word line trenches preferably emerge from the same etching step and have the same depth.

Preferably, the width of the cell insulator trenches is less than and the width of the word line trenches is greater than twice the layer thickness of the gate electrodes. If the gate electrodes emerge from a spacer etching with a conformal disposition of a gate electrode material and subsequent anisotropic etching-back of the deposited gate electrode material, then the gate electrodes of selection transistors of memory cells that are adjacent in a cell row adjoin one another and form the addressing lines, while gate electrode sections that are separated from one another are produced at the sidewalls of the word line trenches.

The recess structures are preferably made of silicon oxide.

If the storage capacitors of the memory cells are formed as hole trench capacitors, then the active zones and the hole trench capacitors assigned to the active zones are in each case arranged within a cell row, in each case two active zones being separated from one another by a hole trench capacitor situated in between. The cell rows are isolated from one another by word line trenches, and the recess trenches are formed perpendicular to the word line trenches and also arranged approximately equidistantly from the two respectively adjacent hole trench capacitors. The addressing lines are provided in the word line trenches and the data lines are led above the substrate surface perpendicular to the word line trenches. The recess structures provided in the recess trenches are arranged offset to the data lines or respectively equidistantly from two adjacent data lines, thus resulting in a small area requirement of the memory cells of approximately $8 \times F^2$.

For memory cells with hole trench capacitors, the recess trenches are preferably filled with silicon nitride. If the recess trenches are introduced with the aid of a silicon oxide mask, then it is possible, when using silicon nitride as filling material, for the filling material to be caused to recede selectively as far as the upper edge of the silicon oxide layer.

In accordance with the method according to the invention for fabricating a DRAM having a memory cell array formed from memory cells having stacked capacitors, and a logic region having logic transistor structures for control, addressing and evaluation of the information stored in the memory cell array, firstly a protective layer is provided on a semiconductor substrate. The protective layer comprises a comparatively thick silicon nitride layer (pad nitride) and a stress compensating layer between the semiconductor substrate and the silicon nitride layer. The stress compensating layer reduces thermomechanical stresses between the silicon nitride layer and the semiconductor substrate that are attributable to different coefficients of thermal expansion of the materials.

Afterward, in a photolithographic process, word line trenches and, perpendicular to the word line trenches, cell insulator trenches are introduced through the protective layer into the semiconductor substrate. In this case, the cell insulator trenches are provided such that they are narrower than the word line trenches. A gate dielectric is provided at sidewalls both of the word line trenches and of the cell insulator trenches.

By conformal deposition and anisotropic etching-back, gate electrodes in the form of sidewall spacers are arranged at the sidewalls of the word line trenches and the cell insulator trenches. In the wide word line trenches, the sections of the sidewall spacers that are opposite one another in a respective one of the word line trenches remain insulated from one another, while the gate electrodes in the narrow cell insulator trenches adjoin one another and are connected to one another.

The word line trenches and the cell insulator trenches are filled with a dielectric from which a word line insulator structure emerges. The protective layer is removed in the memory cell array and the uncovered sections of the semiconductor substrate are doped in order to prepare for the formation of the source/drain regions of the selection transistors in a section adjoining the substrate surface.

An auxiliary layer made of a conductive semiconductor material is applied in the region of the memory cell array and caused to recede as far as the upper edge of the word line insulator structures. Through the auxiliary layer, recess trenches are introduced into the semiconductor substrate between the cell insulator trenches, source/drain regions of the selection transistors that are separated from one another by the recess trenches emerging from the doped sections of the semiconductor substrate.

The recess trenches are either covered or partly or completely filled with a dielectric material. Logic transistor structures are produced in the logic region by processing the logic region. The source/drain regions in the memory cell array are in each case connected to a storage electrode of a stacked capacitor or to a data line.

The method according to the invention makes it possible to fabricate DRAMs having the above-described transistor structures as selection transistors in the memory cell array. It is necessary merely to align an exposure mask for forming the recess trenches relative to a mask for forming the cell insulator trenches. Since none of the effective channel length nor the effective channel width $W_{eff}$ is significantly influenced by a misalignment of the mask for the recess trenches, the method according to the invention advantageously has no critical mask processes or alignment processes for lithographic masks.

A further simplification of the processing results by virtue of the word line trenches, the cell array insulator trenches and also shallow insulator trenches in each case being formed simultaneously in the logic region and being filled with a dielectric material. Afterward, the logic region including the shallow insulator structure is covered with a blocking mask and the dielectric material is etched back in the memory cell array to an extent such that it only fills a lower section of the word line trenches and of the cell insulator trenches and forms bottom insulator structures.

The recess trenches are preferably introduced by a hard mask made of silicon oxide being provided on the auxiliary layer and being patterned photolithographically. The recess trenches are introduced into the semiconductor substrate in the region of the openings of the hard mask by an etching process that acts selectively with respect to silicon oxide.

The processing of the logic region preferably comprises the following steps: firstly, the protective layer is removed in the logic region and a silicon nitride protective coating is applied. After the removal of the silicon nitride protective coating in the logic region, logic transistor structures are formed in the logic region. In this case, the region of the memory cell array remains protected against the processing in the logic region by virtue of the overlying silicon nitride protective coating.

The method according to the invention for fabricating a DRAM having a memory cell array having memory cells with hole trench capacitors as storage capacitors firstly comprises the provision of a protective layer on a semiconductor substrate, in which case the protective layer may have a plurality of partial layers, as described above. Hole trench capacitors are formed in the semiconductor substrate, the hole trench capacitors in each case having a contact window (buried strap window) in the upper section. In the region of the contact window, a storage electrode of the hole trench capacitor that is arranged in the interior of a hole trench electrically conductively adjoins the adjoining semiconductor substrate. Outside the contact window, the hole trench capacitor is electrically insulated from the surrounding semiconductor substrate.

The hole trench capacitors are arranged to form cell rows in the memory cell array. Through the protective layer, word line trenches running parallel to the cell rows are introduced between the cell rows.

A gate dielectric is provided on sidewalls of the word line trenches and gate electrodes are arranged in the manner of sidewall spacers on the gate dielectric. The gate electrodes of selection transistors of memory cells that are adjacent in a cell row adjoin one another and form addressing lines. The word line trenches are filled with a dielectric material that forms word line insulator structures beneath the upper edge of the protective layer. The storage electrodes of the hole trench capacitors are caused to recede to below the upper edge of a substrate surface of the semiconductor substrate, thereby uncovering vertical sidewalls of the protective layer that are oriented toward the hole trench capacitors.

The protective layer or the silicon nitride layer as a constituent part of the protective layer is caused to recede in an etching process having a high isotropic component. Since the vertical sidewalls of the protective layer that are oriented toward the hole trenches are uncovered, a section of the protective layer resting between two hole trench capacitors is in each case caused to recede from the sides oriented toward the hole trench capacitors. After the receding step, residual sections of the protective layer remain only over those regions of the semiconductor substrate which are provided for forming the recess trenches. Since no vertical sidewalls of the protective layer are uncovered in the logic region, the protective layer is caused to recede there only in terms of the layer thickness.

An auxiliary oxide layer is applied and caused to recede as far as the upper edge of the residual sections of the protective layer. The residual sections of the protective layer are removed selectively with respect to the auxiliary oxide layer.

A mask for forming the recess trenches has thus emerged from the protective layer in an advantageous and self-aligned manner and without a photolithographic process.

Before the introduction of the recess trenches, the logic region is covered by a blocking mask. The recess trenches are introduced into the semiconductor substrate with the auxiliary oxide layer as a mask in the region of the memory cell array. The blocking mask over the logic region is removed. The recess trenches are covered or at least partly filled with a dielectric.

The logic region is processed, logic transistor structures being formed in the logic region.

The source/drain regions of the selection transistors that are not connected to a storage electrode via a contact window are in each case connected to a data line.

An essential advantage of the method according to the invention resides in the self-aligned formation of a non-photolithographic mask for forming the recess trenches.

In accordance with a preferred embodiment of the method according to the invention, the word line trenches and shallow insulator trenches are filled with a dielectric material in the logic region, the logic region including the shallow insulator structures is covered with a temporary blocking mask and the dielectric material is then caused to recede in the memory cell array. As a result of the dielectric material that has been caused to recede, bottom insulator structures are formed in lower sections of the word line trenches. The insulator structures are advantageously formed simultaneously in the logic region and in the memory cell array.

In accordance with a preferred embodiment of the method according to the invention, source/drain regions of the selection transistors are formed by an implantation, the residual sections of the protective layer that have been caused to recede being used as an implantation mask.

According to a preferred embodiment of the method according to the invention, the filling of the recess trenches firstly comprises an oxidation of the sidewalls of the recess trenches. A conformal nitride liner is deposited and caused to recede essentially anisotropically to below the upper edge of the auxiliary oxide layer.

Parts of the method described can advantageously also be used for fabricating known recess channel transistor structures for memory cells. For this purpose, a protective layer is provided on a semiconductor substrate. Hole trench capacitors arranged to form cell rows are formed in the semiconductor substrate, a storage electrode of the hole trench capacitor being formed in each case by filling a hole trench with a conductive material. The storage electrodes of the hole trench capacitors are caused to recede to below the lower edge of the protective layer. The protective layer is etched back in an etching process having a high isotropically acting component, with the result that residual sections of the protective layer in each case remain in a self-aligned manner approximately centrally between in each case two hole trench capacitors that are adjacent in a cell row. The residual sections of the protective layer that have been caused to recede form a mask for implantation of source/drain regions of the selection transistors that are to be provided in the semiconductor substrate and/or a precursor mask for forming recess trenches.

In order to form the recess trenches, after the protective layer has been caused to recede isotropically, an auxiliary oxide layer is applied, which is subsequently caused to recede as far as the upper edge of the residual sections of the protective layer. After the removal of the residual sections of the protective layer, a self-aligned mask for the introduction of recess trenches is produced by the auxiliary oxide layer.

In contrast to the previously mentioned methods, in this case a section of a gate electrode of the respective selection transistor is provided in the recess trenches. In contrast to customary methods for fabricating conventional recess channel transistors, the critical overlay of the lithographic mask for forming the hole trenches with the mask for forming the recess trenches is obviated. According to the invention, the lithographic mask for forming the recess trenches is unnecessary; it is instead produced in a self-aligned manner with respect to the hole trenches.

BRIEF DESCRIPTION OF THE DRAWINGS

The invention and its advantages are explained in more detail below with reference to figures, mutually corresponding components in each case being designated by the same reference symbols, in each case in a simplified schematic illustration that is not true to scale:

FIGS. 3A-3K show a plan view of and cross sections through a memory cell array according to the invention having stacked capacitors according to a second exemplary embodiment of the invention in different phases of the method according to the invention according to a third exemplary embodiment; and FIGS. 4A-4I show a plan view of and cross sections through a memory cell array according to the invention having hole trench capacitors according to a fourth exemplary embodiment of the invention in different phases of the method according to the invention according to a further exemplary embodiment.

DETAILED DESCRIPTION

Figure 1:
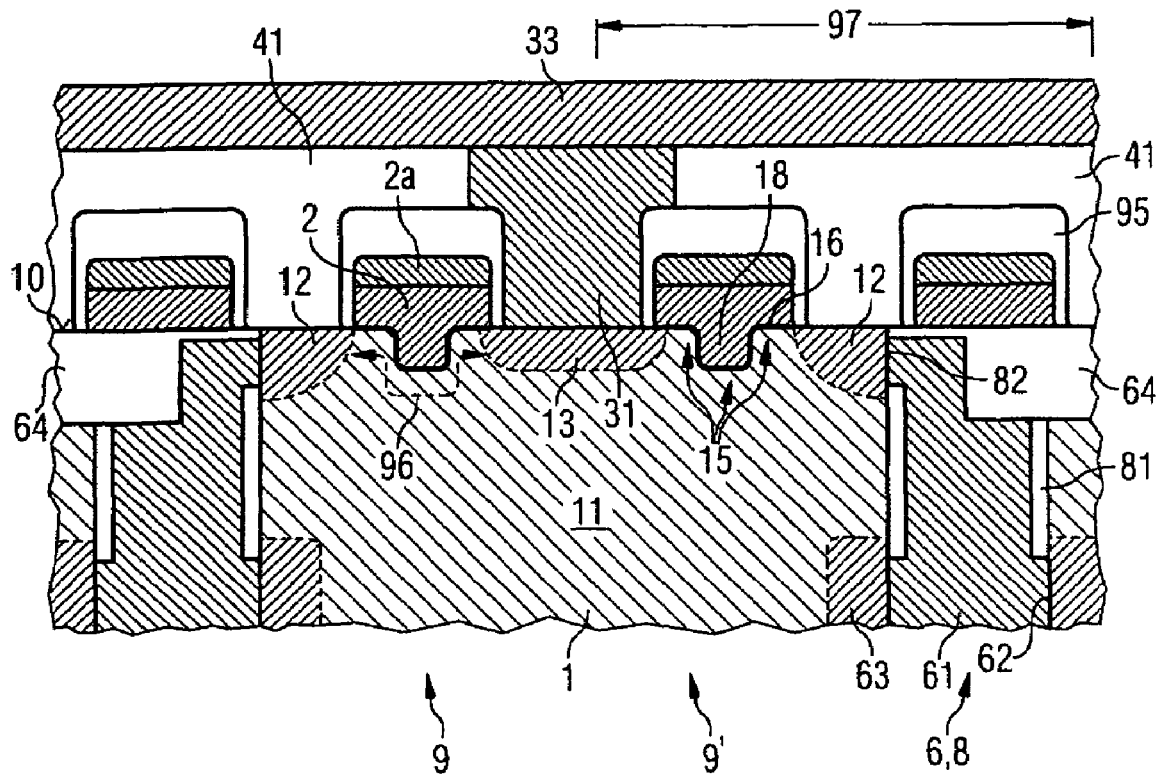
FIG. 1 shows a schematic cross section through a known memory cell arrangement having selection transistors having gate electrodes grooved into the semiconductor substrate (grooved gate)
Figure 2:
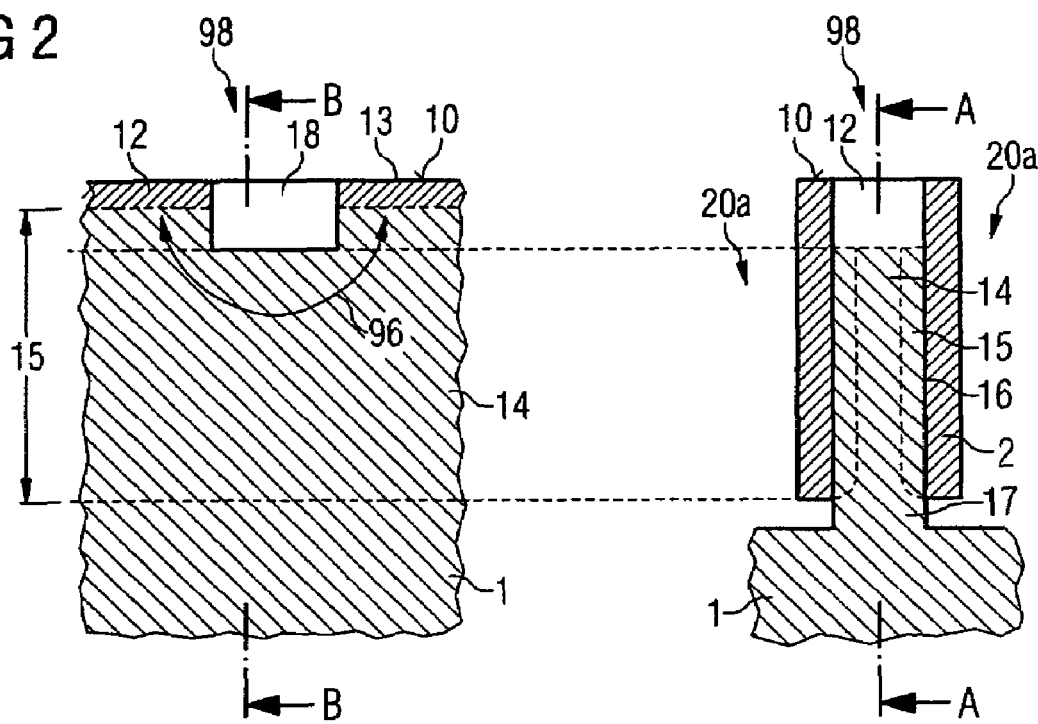
FIG. 2 shows two cross sections through a transistor structure according to the invention according to a first exemplary embodiment of the invention.

FIG. 2 shows on the left a cross section through a transistor structure 98 according to the invention, and a cross section perpendicular thereto in the right-hand illustration.

In a semiconductor substrate 1, a first source/drain region 12 and a second source/drain region 13 are formed along a substrate surface 10 along an x axis. The two source/drain regions 12, 13 are spaced apart from one another by a recess trench 18. The recess trench 18 is introduced from the substrate surface 10 to below a lower edge of the source/drain regions 12, 13. Beneath the source/drain regions 12, 13, a body region 14 of the transistor structure 98 is formed by the semiconductor substrate 1. The body region 14 is surrounded by a gate electrode 2 and is in this case spaced apart from the gate electrode 2 by a gate dielectric 16. The gate electrode 2 extends essentially from the lower edge of the source/drain regions 12, 13 to beneath a lower edge of the recess trench 18. The recess trench 18 is filled with a dielectric material or remains unfilled. The filled or only covered recess trench 18 forms a recess structure. The gate electrode 2 is provided in two partial sections in two gate electrode trenches 20a running parallel to the x axis.

During operation of the transistor structure 98, by a suitable potential at the gate electrode 2, in a section of the body region that adjoins the gate dielectric 16, a conductive channel 15 is formed between the two source/drain regions 12, 13. A cell current 96 flows through the channel 15. The length of the channel 15 is essentially determined by the depth of the recess structure 18. The effective channel width is determined by the extent of the gate electrode 2 in the vertical direction with respect to the substrate surface 10. The source/drain regions 12, 13 and also the body region 14 form an active zone 11, which is formed in a fin 17 of the semiconductor substrate 1, the fin 17 being bounded by the gate electrode 2 on at least two mutually opposite sides.

FIG. 3A shows a plan view of a detail from a memory cell array. In this case, the storage capacitors of the memory cells are formed as stacked capacitors. The memory cells are arranged in mutually orthogonal cell rows and cell columns and the storage capacitors are arranged within the cell rows and cell columns in each case in a manner alternating with selection transistors in a chessboard-like manner.

The active zones 11 of the selection transistors are illustrated as rectangular and separated from one another within a row by narrow cell insulator trenches 64. Word line trenches 20 are introduced between the cell rows formed by the active zones 11 and the cell insulator trenches 64, the word line trenches having a larger width than the cell insulator trenches 64. The source/drain regions 12, 13 of the active zones 11 are in each case arranged along the row axis corresponding to the x axis of FIG. 2. The two source/drain regions 12, 13 of a respective active zone 11 are separated from one another by a recess trench 18, which has a smaller depth than the word line trenches 20 and the cell insulator trenches 64. Respectively adjacent source/drain regions 12, 13 of active zones 11 arranged in a cell column are in each case assigned alternately to a data line 33 or a stacked capacitor. The position of the stacked capacitors results from the position of the respective storage electrodes 61, which in each case rests on a node pad 36 as upper termination of a capacitor connection structure.

The first source/drain regions 12 are connected to the storage electrode 61 of the respectively assigned stacked capacitor via the capacitor connection structures. The second source/drain regions 13 are connected via bit line contacts 32 to data lines 33 routed between the bit line contacts 32 and an upper edge of the capacitor connection structures or node pads 36.

Figure 3C:
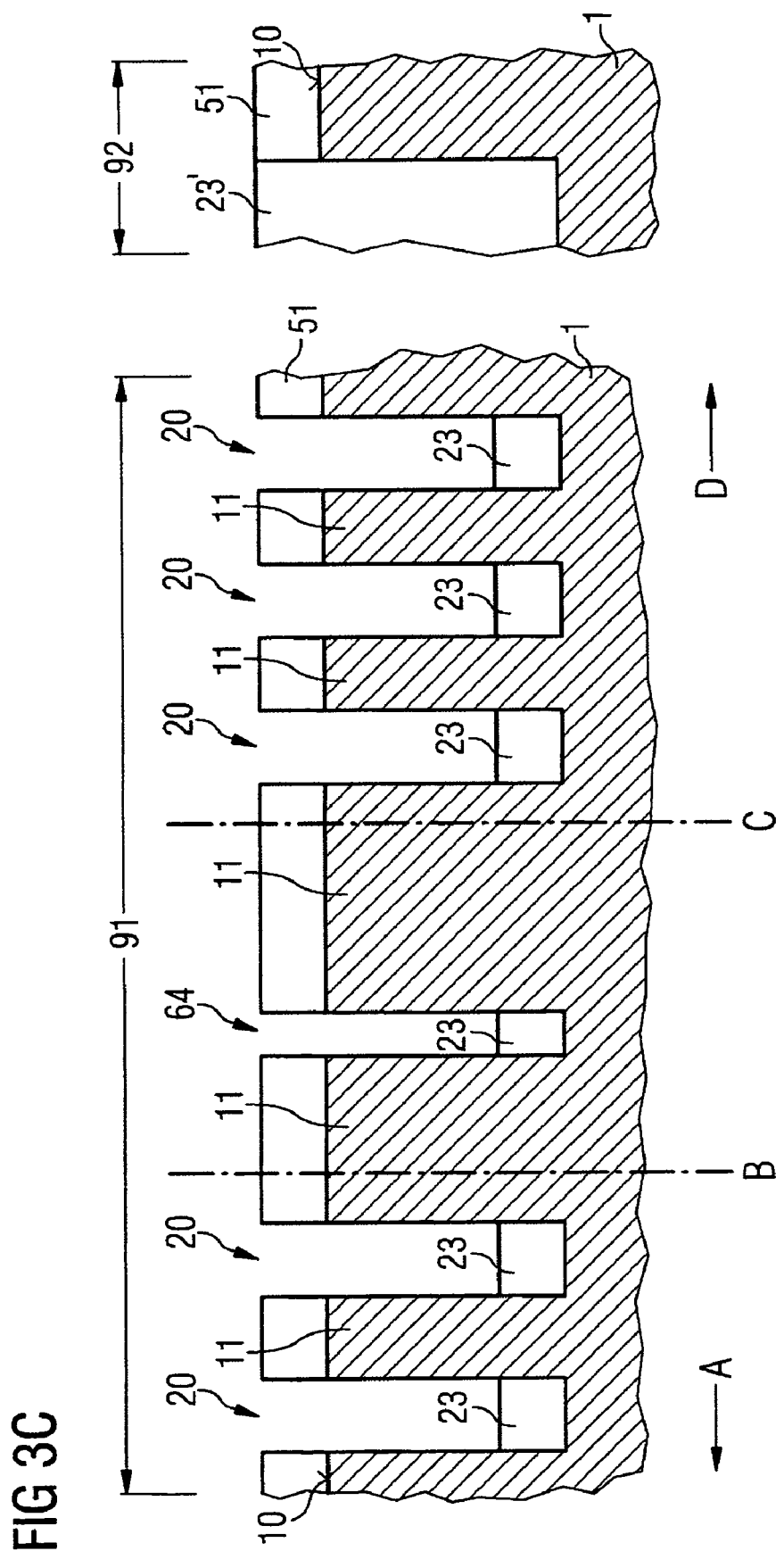

FIG. 3C to FIG. 3K illustrate cross sections along the line A-B-C-D in FIG. 3A in various phases of an exemplary embodiment of the method according to the invention.

A semiconductor substrate 1 is provided and a stress equalizing layer, for instance made of silicon dioxide (pad oxide), is applied on a substrate surface 10 of the semiconductor substrate 1. Well implantations are optionally embodied in the memory cell array at this point in time. A silicon nitride layer (pad nitride) is applied as protective layer 51 to the stress equalizing layer. Active zones 11 of selection transistors are patterned in a photolithographic process. The requisite exposure is performed twice with a head-to-head distance of less than F.

The semiconductor substrate 1 is patterned in the region of a memory cell array 91 by wide word line trenches 20 and narrow cell insulator trenches 64 running perpendicular to the word line trenches 20, fins with the active zones 11 being shaped between the word line trenches 20 and the cell insulator trenches 64 in the semiconductor substrate 1. The sidewalls of the active zones 11 are oxidized by an oxidation process. Shallow insulator trenches are formed at the same time as the word line trenches 20 and the cell insulator trenches 64 in a logic region 92 supplementing the memory cell array 91.

The cell insulator trenches 64, the word line trenches 20 and also the shallow insulator trenches are filled with silicon oxide. The silicon oxide is planarized and in the process caused to recede as far as the upper edge of the protective layer 51. The logic region 92 including the shallow insulator trenches is covered by a blocking mask and the silicon oxide is etched back into the trenches 20, 64 in the memory cell array 91.

FIG. 3C reveals the state of a semiconductor substrate 1 processed in the manner described after the silicon oxide has been caused to recede. The protective layer 51 rests on a substrate surface 10 of the semiconductor substrate 1. In the logic region 92, shallow insulator structures 23' have emerged from the shallow insulator trenches.

In the memory cell array 91, word line trenches 20 and cell insulator trenches 64 having the same depth are introduced into the semiconductor substrate 1 through the protective layer 51. Bottom insulator structures 23 formed by the silicon oxide are in each case arranged in the lower section of the word line trenches 20 and of the cell insulator trenches 64.

A gate dielectric 16 is formed on the sidewalls of the active zones 11 by oxidation of the material of the semiconductor substrate 1. By conformal deposition of titanium nitride or doped polysilicon, sidewall spacer structures 21 are formed as sections of gate electrodes on the sidewalls of the word line trenches 20 and of the cell insulator trenches 64.

Figure 3D:
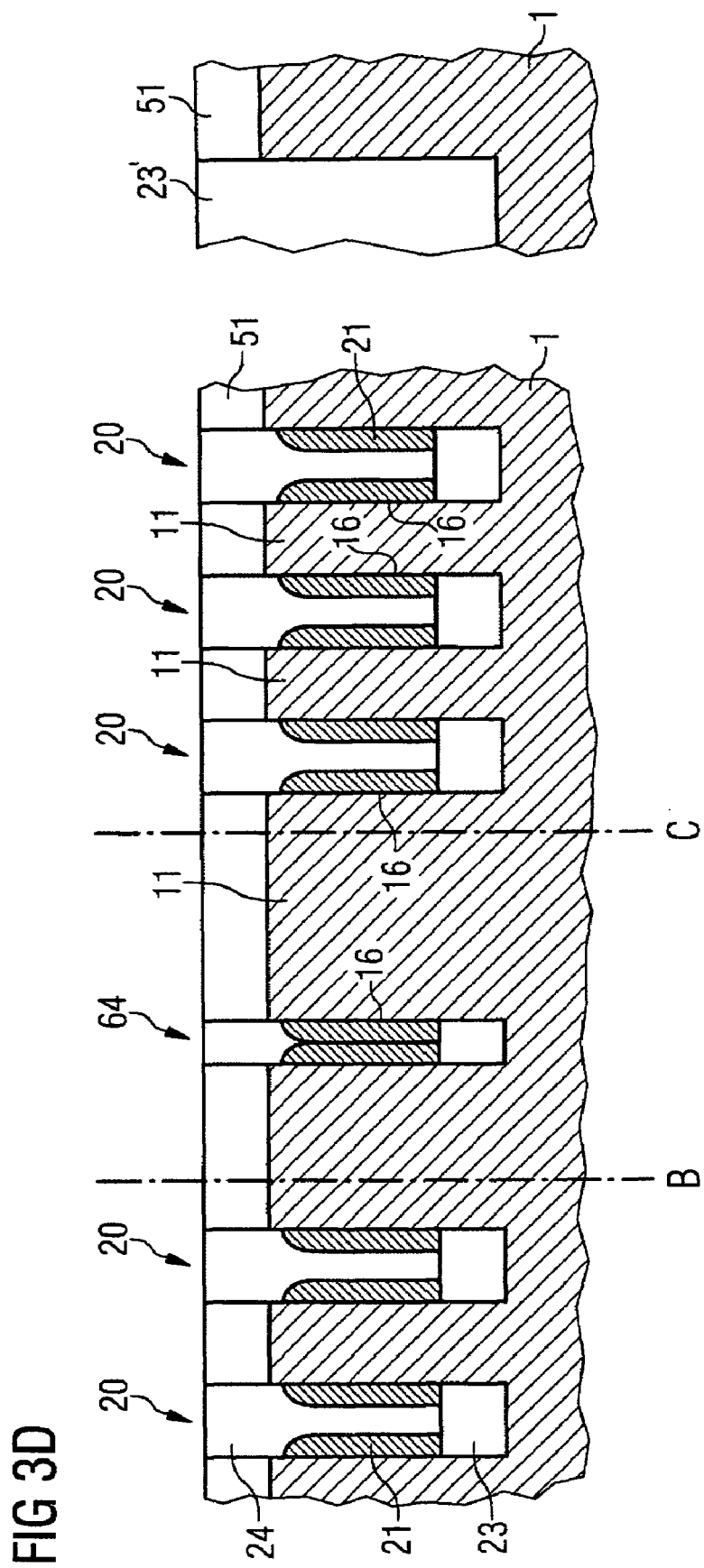

As illustrated in FIG. 3D, in this case the sidewall spacer structures 21 are separated from one another in the wide word line trenches 20, whereas in the narrow cell insulator trenches 64 they adjoin one another and form conductive structures or addressing lines that are contiguous along the cell row.

After the formation of the sidewall spacer structures 21, the word line trenches 20 and also the cell insulator trenches 64 are filled with a dielectric material. The dielectric material is caused to recede as far as the upper edge of the protective layer 51 by a planarization step. The dielectric material that has been caused to recede forms word line insulator structures 24 in the word line trenches 20 and the cell insulator trenches 64.

In the memory cell array 91, the protective layer 51 is removed and the formation of source/drain regions 12, 13 is prepared by doping of sections of the semiconductor substrate 1 which is uncovered in the region of the memory cell array 91, said sections adjoining the substrate surface 10. An auxiliary layer 71 made of n-doped polysilicon is applied and caused to recede by a planarization step as far as the upper edge of the word line insulator structures 24 in a manner corresponding to the upper edge of the protective layer 51 in the logic region 92.

Figure 3E:
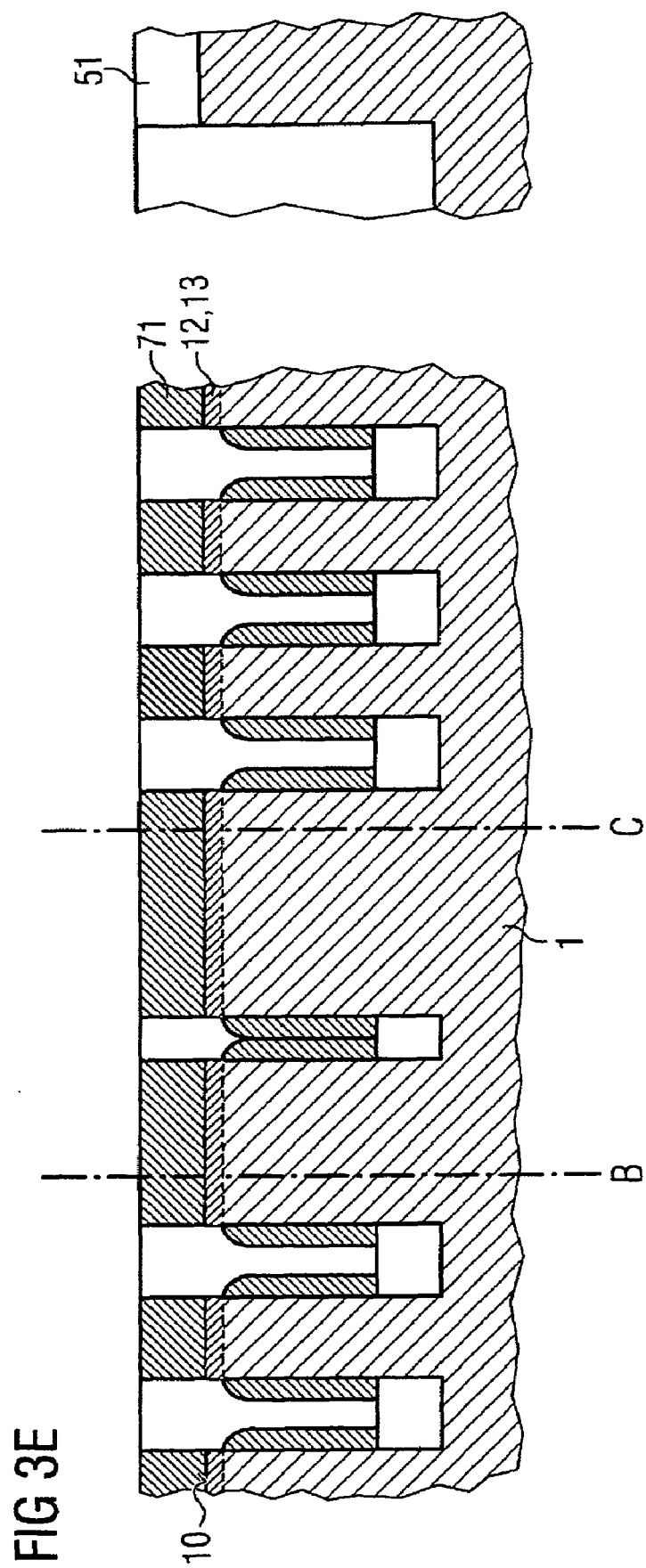

In accordance with FIG. 3E, the protective layer 51 is replaced by the auxiliary layer 71 in the memory cell array 91. A section of the semiconductor substrate 1 that adjoins the substrate surface 10 is doped in preparation for the formation of the source/drain regions 12, 13.

A hard mask 72 is applied to the auxiliary layer 71 in the region of the memory cell array 91 and also to the section of the protective layer 51 that remains in the logic region 92, and is patterned by a photolithographic method for forming the recess trenches 18.

Figure 3F:
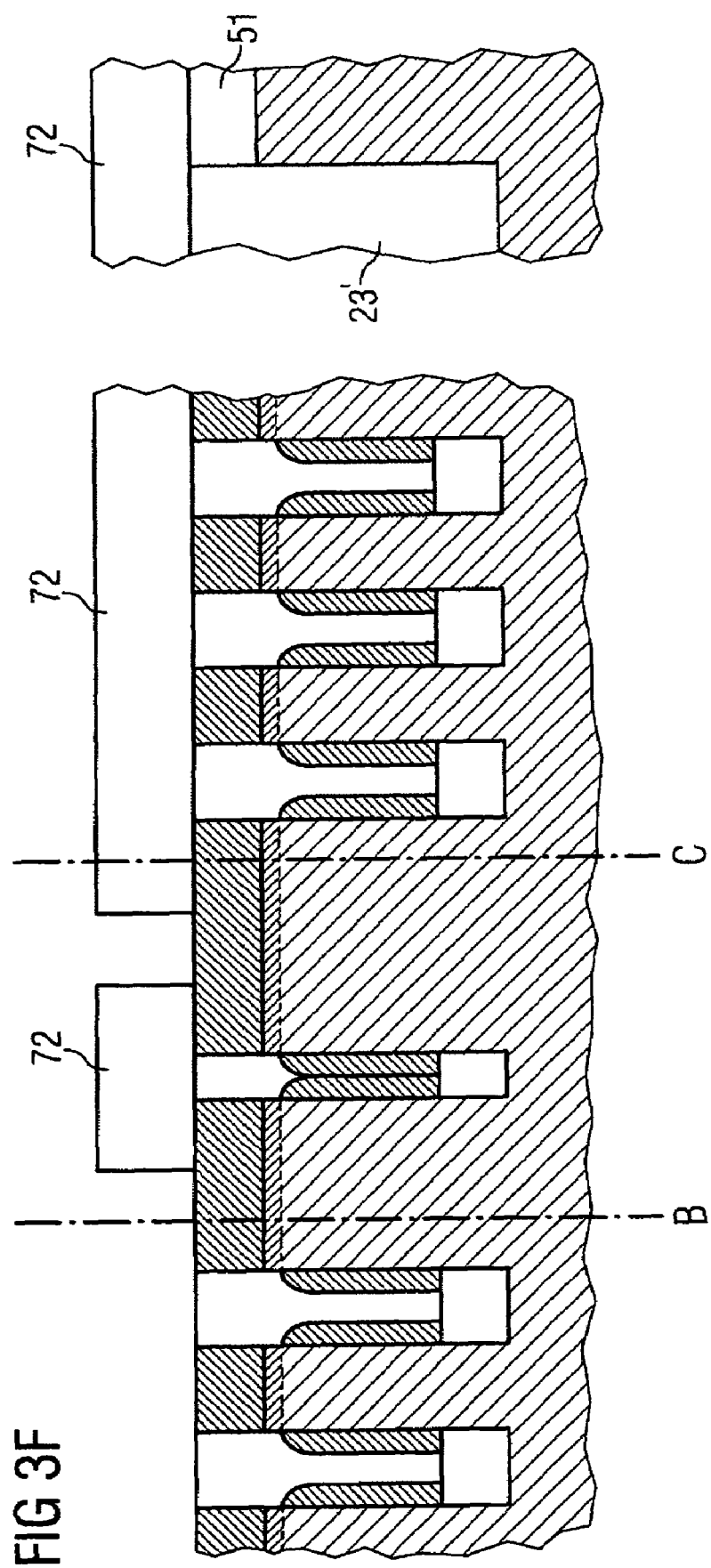

In accordance with FIG. 3F, the hard mask 72 is opened at the locations provided for forming the recess trenches 18.

The recess trenches 18 are introduced into the semiconductor substrate 1 through the openings of the hard mask 72 and through the auxiliary layer 71 by an etching process that acts selectively with respect to silicon oxide. The mask for forming the recess trenches 18 is striplike.

The sidewalls of the recess trenches 18 are oxidized. The recess trenches 18 are filled with silicon oxide, which is subsequently caused to recede as far as the upper edge of the auxiliary layer 71 by a planarization step. The protective layer 51 is removed in the logic region 92. A silicon nitride protective coating 73 is applied over the whole area and subsequently removed again in the logic region 92.

FIG. 3G shows the recess trenches 181 filled with silicon oxide and also the silicon nitride protective coating 73 covering the memory cell array 91.

The silicon nitride layer protective coating 73 protects the structures formed in the region of the memory cell array 91 against processing in the logic region 92. In the course of the processing of the logic region 92, logic transistor structures 93 having logic gate structures 53 and logic source/drain regions 54 are formed in the logic region 92 for instance in the course of a dual work function process. An interlayer dielectric 41 is applied and planarized. In a photolithographic process, openings corresponding to second source/drain regions 13 that are to be connected to a data line 33 are introduced into the interlayer dielectric 41.

FIG. 3H shows logic transistor structures 93 having logic gate structures 53 and logic source/drain regions 54 in the logic region 92. In the memory cell array 91, the interlayer dielectric 41 together with the underlying silicon nitride protective coating 73 is opened above the second source/drain regions 13.

The openings in the interlayer dielectric 41 are filled with a conductive material, for instance tungsten. After a planarization step, the conductive material caused to recede into the openings forms bit contacts 32, which adjoin the sections of the auxiliary layer 71 which are assigned to the second source/drain regions 13.

Once again a conductive material, for instance tungsten, and also silicon nitride are deposited successively. In a photolithographic method, the silicon nitride layer and the underlying layer made of the conductive material are patterned jointly, data lines 33 emerging from the layer made of the conductive material and a data line dielectric 42 covering the data lines 33 emerging from the silicon nitride layer. Vertical sidewalls of the data lines 33 are covered with silicon nitride spacer structures by conformal deposition and anisotropic etching-back. A further filling dielectric 43 (BL interdielectric fill) is provided between the data lines 33 by deposition and subsequent receding as far as the upper edge of the data line dielectric 42.

In accordance with FIG. 3I, the second source/drain regions are in each case connected via bit line contacts 32 to data lines 33 routed above the substrate surface 10. The data lines 33 are covered by a data line dielectric 42. Between the data lines 33, an intermediate data line dielectric 43 supplements the interlayer dielectric 41. Equivalently to this, a wiring plane 32' is shaped in the logic region 92.

A further silicon dioxide layer is deposited and capacitor connection structures 35 are patterned, via which the first source/drain regions 12 are to be connected to storage electrodes 61 of stacked capacitors 7 that are subsequently to be processed. In this case, sections of the conductive auxiliary layer 71 are uncovered in the region of the first source/drain regions 12 by an etching through the further silicon dioxide layer and between two data lines 33 that are in each case encapsulated by silicon nitride spacer structures. The contact holes produced in this way are filled with a conductive material, for instance tungsten. The conductive material is planarized, capacitor connection structures 35 being formed in the contact holes. Aerially extended node pads 36 rest on the capacitor connection structures 35.

Figure 3J:
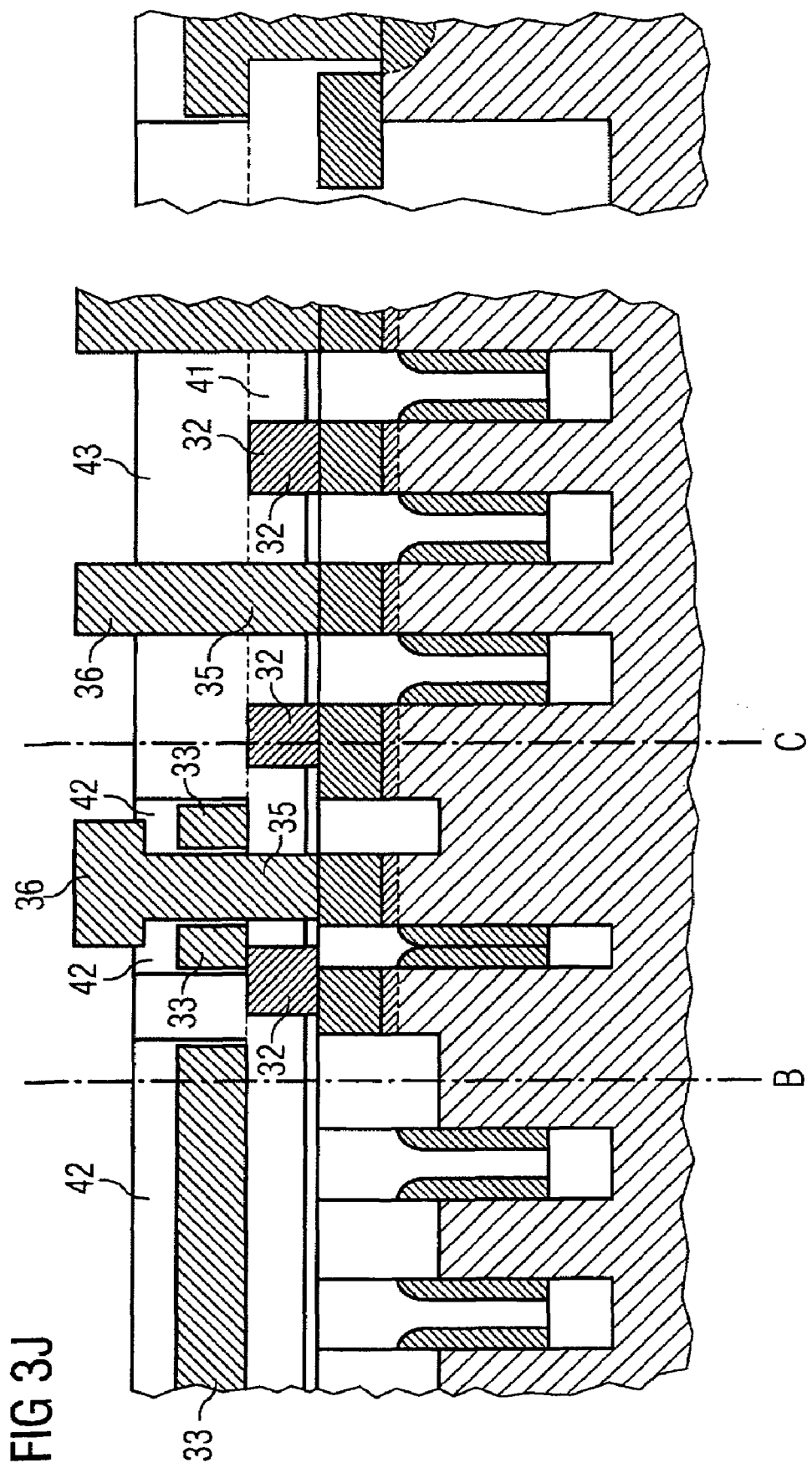

FIG. 3J shows capacitor connection structures 35 that are led as far as the upper edge of the sections of the auxiliary layer 71 that correspond to the first source/drain regions 12.

Stacked capacitors 7 are subsequently formed, the storage electrodes 61 of which in each case rest on the node pads 36 and adjoin them.

Figure 3K:
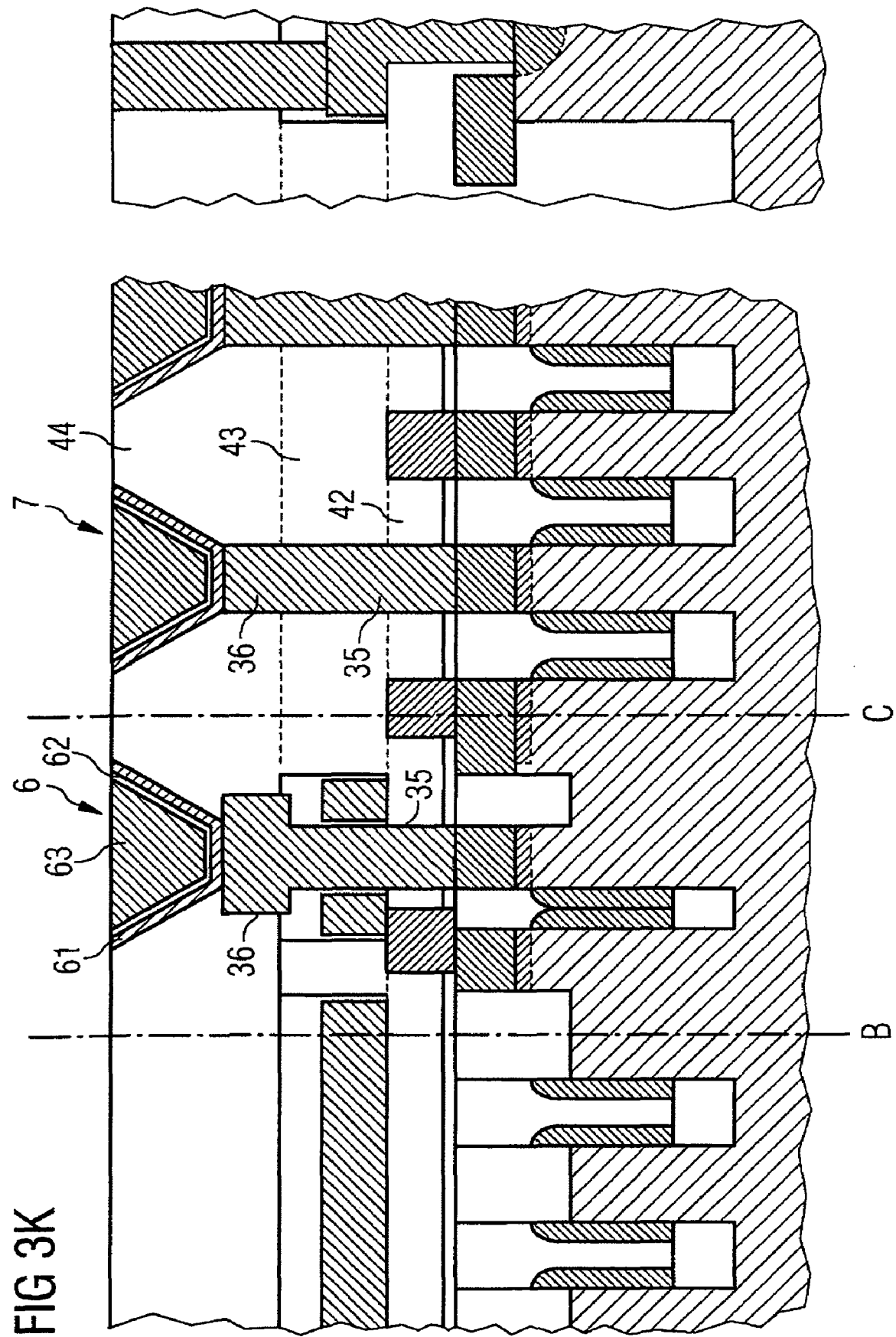

FIG. 3K illustrates storage capacitors 6 formed as stacked capacitors 7. The stacked capacitors 7 in each case comprise a storage electrode 61, a counterelectrode 63 and a capacitor dielectric 62 that spaces apart the two electrodes 61, 63 from one another. The storage electrode 61 in each case electrically conductively adjoin the respectively assigned node pad 36.

The structure and also the functioning of the memory cell are explained with reference to the two cross sections illustrated in FIG. 3B.

The left-hand illustration of FIG. 3B shows a cross section through a memory cell according to the invention along a row direction which is predetermined by the arrangement of the two source/drain regions 12, 13 and defines an x axis. The right-hand illustration shows two memory cells arranged in two adjacent cell rows perpendicular to the x axis, the two source/drain regions 12, 13 of two adjacent selection transistors in each case being arranged offset relative to one another.

As can further be gathered from the left-hand illustration of FIG. 3B, the active zones 11 of selection transistors that are in each case adjacent in a cell row are separated from one another by cell insulator trenches 64. A first source/drain region 12 is in each case formed within the active zone 11, and is connected to a storage electrode 61 of a stacked capacitor via a section of an auxiliary structure 71 and a capacitor connection structure 36. A second source/drain region 13 is connected to a data line 33 via a further section of the auxiliary structure 71 and via an adjoining bit line contact 32. The lower section of the cell insulator trenches 64 is filled with a bottom insulator structure 23. Between the two source/drain regions 12, 13, the semiconductor substrate 1 forms a body region 14 into which a recess trench 18 is introduced.

The right-hand illustration of FIG. 3B reveals that the active zones 11 are enclosed along the x axis by gate electrodes in the form of sidewall spacer structures 21 which are spaced apart from the semiconductor substrate 1 and the active zones 11 by a gate dielectric 16.

If a suitable potential is applied to the gate electrode or the sidewall spacer structure 21, then a conductive channel 15 forms in the sections of the body zone 14 that are opposite to the sidewall spacer structures 21 at the gate dielectric 16, the conductive channel connecting the two source/drain regions 12, 13 to one another. The effective channel length $L_{eff}$ of the channel 15 results from the depth of the filled recess trench 18. The effective channel width $W_{eff}$ of the channel 15 results from the distance between the lower edge of the recess structure in the recess trench 18 and the lower edge of the sidewall spacer structures 21.

The drawings of FIGS. 4A-4I illustrate an exemplary embodiment of a method for forming a memory cell array having hole trench capacitors as storage capacitors.

Figure 4A:
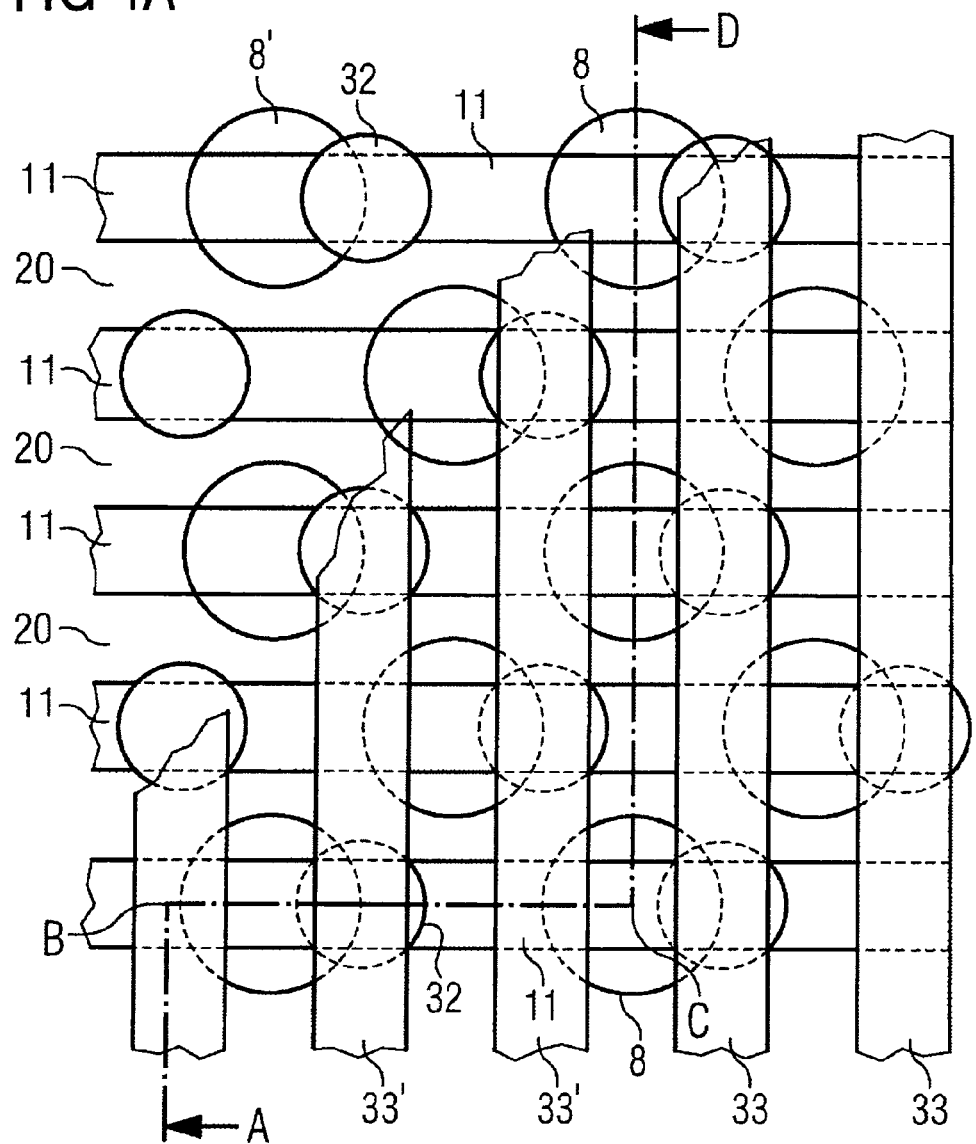

FIG. 4A shows the structure to be processed in plan view. In this case, the selection transistors are represented by active zones 11 assigned to them. The active zones 11 are arranged with the respectively assigned hole trench capacitors 8 in cell rows which are arranged offset relative to one another, thus resulting in a chessboard-like arrangement of active zones 11 and hole trench capacitors 8. The active zone 11 of a memory cell is delimited by in each case two hole trench capacitors 8 within a cell row, one of the two hole trench capacitors 8 that delimit the active zone 11 having a contact window in the region of which a first source/drain region 12 of the active zone 11 adjoins a storage electrode 61 in the interior of the hole trench capacitor 8. The active zone 11 is insulated from the storage electrode of the other hole trench capacitor 8' by a collar insulator structure provided in the interior of the hole trench capacitor 8.

Word line trenches 20 are introduced between the cell rows formed by the hole trench capacitors 8 and the active zones 11, said word line trenches intersecting an upper section of the hole trench capacitors 8. Data lines 33 are routed orthogonally with respect to the word line trenches 20, and are connected via bit line contacts 32 to in each case a second source/drain region 13 of the selection transistors or the active zones 11. Recess trenches 18 are introduced into the active zones 11 in each case between the bit lines 33, which recess trenches in each case separate the first source/drain regions 12 from the second source/drain regions 13 and the depth of which recess trenches predefines an effective channel length $L_{\mathit{eff}}$ of the selection transistors.

An illustration is given below of an exemplary embodiment of the method according to the invention for fabricating a DRAM having such a memory cell array along the cross section A-B-C-D of FIG. 4A.

A protective layer 51 made of silicon nitride, under which is situated a stress equalizing layer, is applied to a semiconductor substrate 1. Hole trenches are introduced into the semiconductor substrate 1 by a photolithographic process. Hole trench capacitors 8 are formed in a manner oriented in or at the hole trenches. In an upper section, the hole trench capacitors 8 are in each case lined by a collar insulator structure 81, which insulates a storage electrode 61 provided in the interior of the hole trench from the active zones 11 formed in the adjoining semiconductor substrate 1. Opposite a respective active zone 11 that is adjacent in the cell row, the collar insulator structure 81 has an opening that forms a contact window 82. The formation of the hole trench capacitor 8 is concluded by the formation of the storage electrode 61, for which the hole trench is finally filled with doped polysilicon that is subsequently caused to recede as far as the upper edge of the protective layer 51.

By a photolithographic process, word line trenches 20 are introduced in striplike fashion parallel to the cell rows. The cell rows are separated from one another by the word line trenches 20. Uncovered vertical sidewalls of the active zones 11 are oxidized. The word line trenches 20 in the memory cell array 91 and shallow insulator trenches in the logic region 92, which have emerged for instance from the same lithographic process, are filled with silicon oxide that is subsequently caused to recede as far as the upper edge of the protective layer 51. The silicon oxide is caused to recede into the word line trenches 20 by an etching-back step that acts only in the memory cell array 91.

Figure 4B:
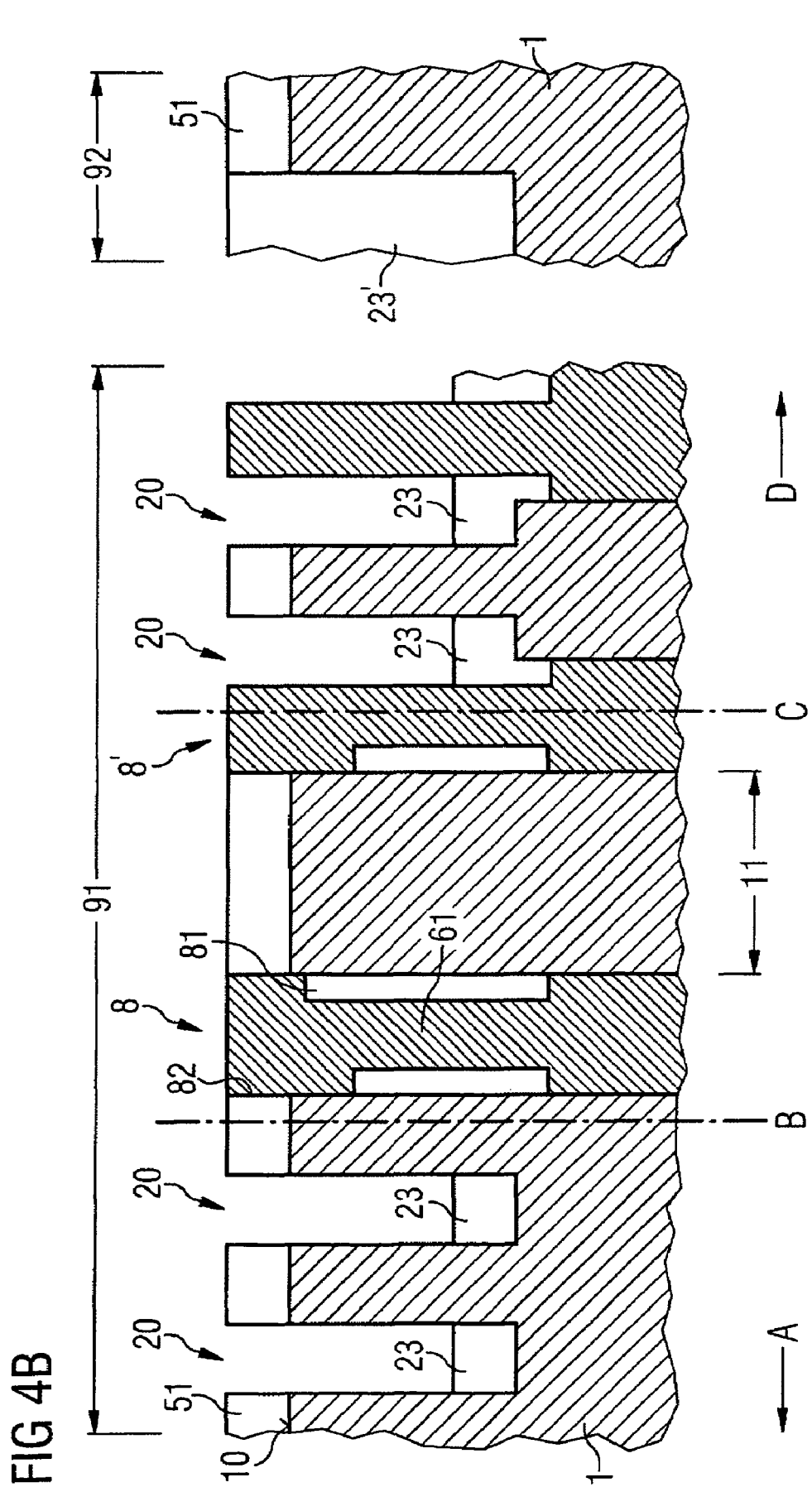

FIG. 4B illustrates the silicon oxide that has been caused to recede and forms bottom insulator structures 23 in lower sections of the word line trenches 20. In the logic region 92, the silicon oxide is not caused to recede and forms shallow insulator structures 23'.

In the memory cell array 91, the active zone 11 of a selection transistor assigned to a hole trench capacitor 8' is delimited by two hole trench capacitors 8, 8'. The storage electrode 61 of the hole trench capacitor 8' adjoins the active zone 11 in the region of a contact window 82. The storage electrode 61 of the second hole trench capacitor 8 that delimits the active zone 11 in the cell row is insulated from the active zone 11 of the memory cell by the collar insulator structure 81.

A gate dielectric 16 is formed on the uncovered vertical sidewalls of the active zones 11 by an oxidation process. By conformal deposition and anisotropic etching-back of a conductive material such as titanium nitride or doped polysilicon, gate electrodes are formed in the manner of sidewall spacer structures 21 on the sidewalls of the word line trenches 20. The word line trenches 20 are subsequently filled with a dielectric material that is caused to recede as far as the upper edge of the protective layer 51 by a planarization step and forms word line insulator structures 24 in the word line trenches 20. The upper edge of the storage electrode 61 is caused to recede to below the lower edge of the protective layer 51 by an etching step that acts selectively on polysilicon.

Figure 4C:
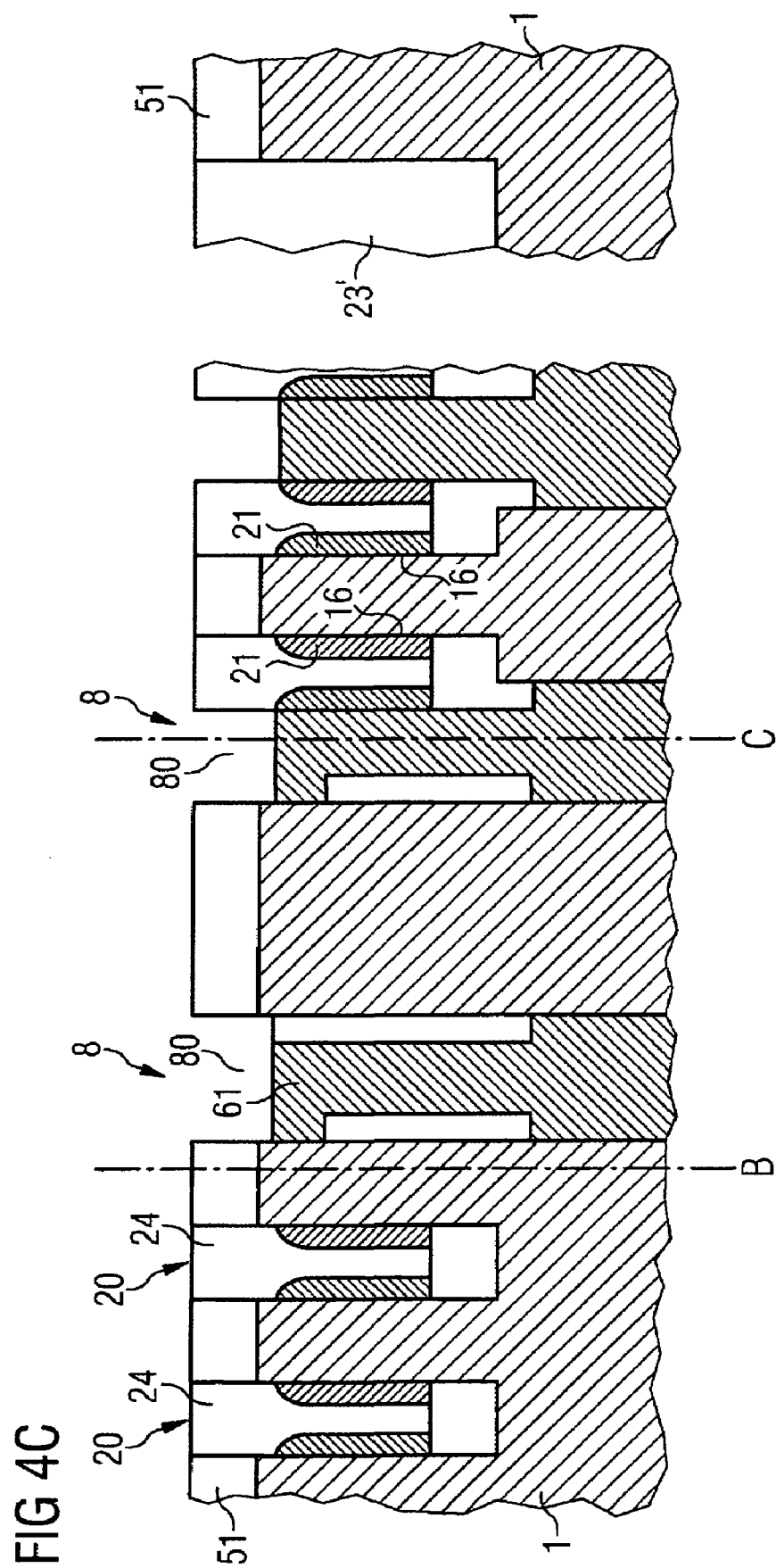

FIG. 4C illustrates the sidewall spacer structures 21 in the word line trenches 20, which in each case enclose an active zone 11 on both sides. The sidewall spacer structures 21 arranged within a word line trench 20 are insulated from one another by the word line insulator structure 24. The sidewall spacers structures 21 respectively forming the gate electrode of active zones 11 that are respectively adjacent in a cell row adjoin one another via the intervening hole trench capacitors 8, 8' and form addressing lines.

The protective layer 51 or a silicon nitride layer portion thereof is caused to recede by an etching process having an isotropically acting component. Since the vertical sidewalls of the residual sections of the protective layer 51 that are oriented toward the hole trench capacitors 8, 8' are uncovered, the protective layer 51 is also caused to recede from the side areas oriented toward the hole trench capacitors 8, 8'. The receding process is terminated as soon as residual sections 511 of the protective layer that has been caused to recede in each case cover that section of the active zone 11 which is provided for forming the recess trenches 18.

Figure 4D:
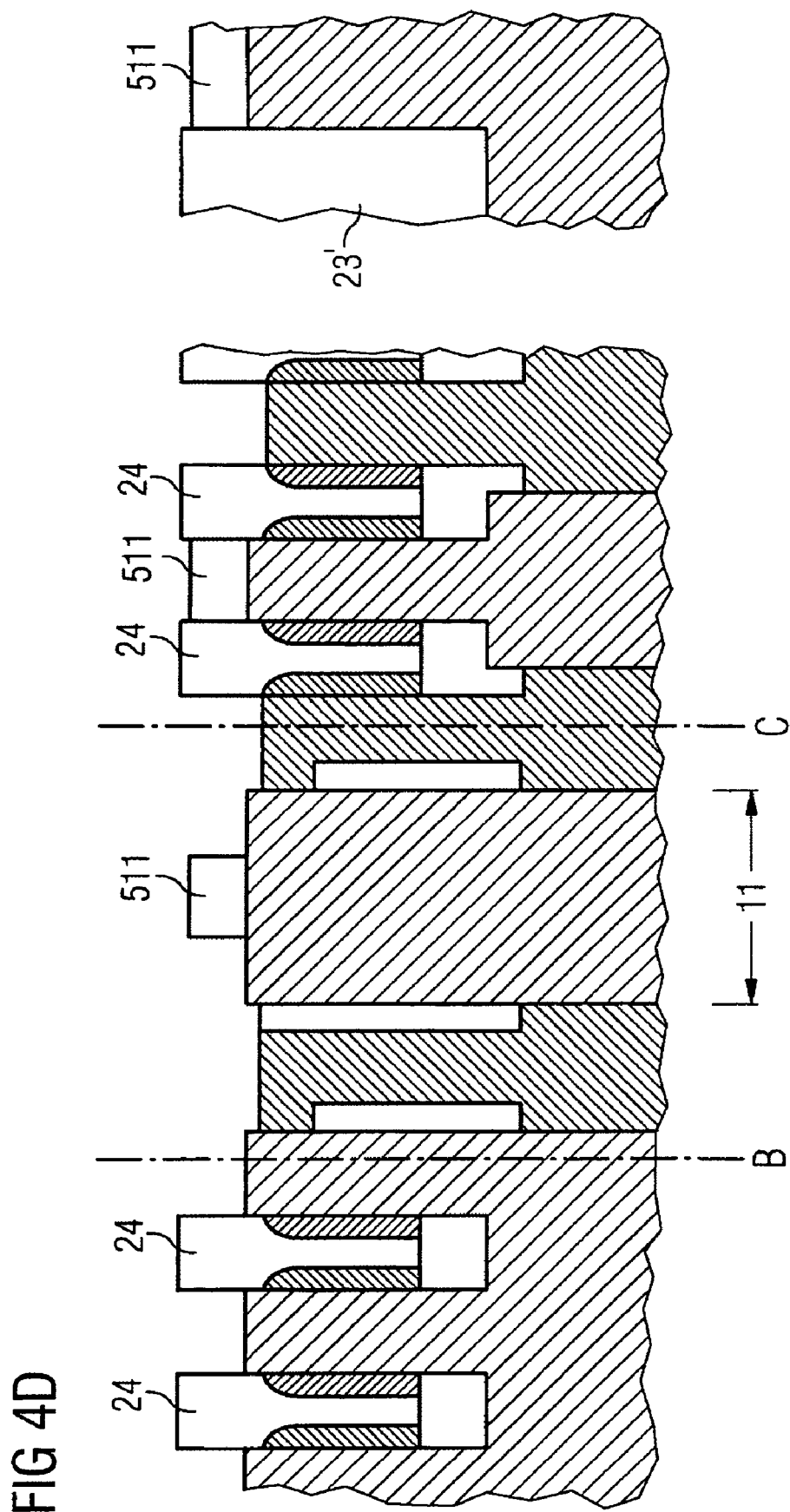

FIG. 4D illustrates the sections of the protective layer 511 that has been caused to recede in this way. The sections of the protective layer 511 that has been caused to recede have a smaller layer thickness than the original protective layer 51. No etching attack has taken place via the side areas of the protective layer 51 that are covered by the word line insulator structures 24. By contrast, the protective layer 51 has been caused to recede from the side areas oriented toward the hole trench capacitors 8 and completely covers only a central section of the active zone 11 between the two adjacent word line insulator structures 24. The protective layer 51 has not been caused to recede from the side areas facing the word line insulator structures 24.

A section of the semiconductor substrate 1 that adjoins the substrate surface 10 is doped by implantation, thus preparing for the formation of source/drain regions 12, 13. An auxiliary oxide layer 84 is applied and is caused to recede by a planarization step as far as the upper edge of the protective layer 511 that has been caused to recede. The residual sections 511 of the protective layer that have been caused to recede are removed and, for the subsequent etching step, the logic region 93 is covered by a blocking mask 52 made of a photoresist material.

Figure 4E:
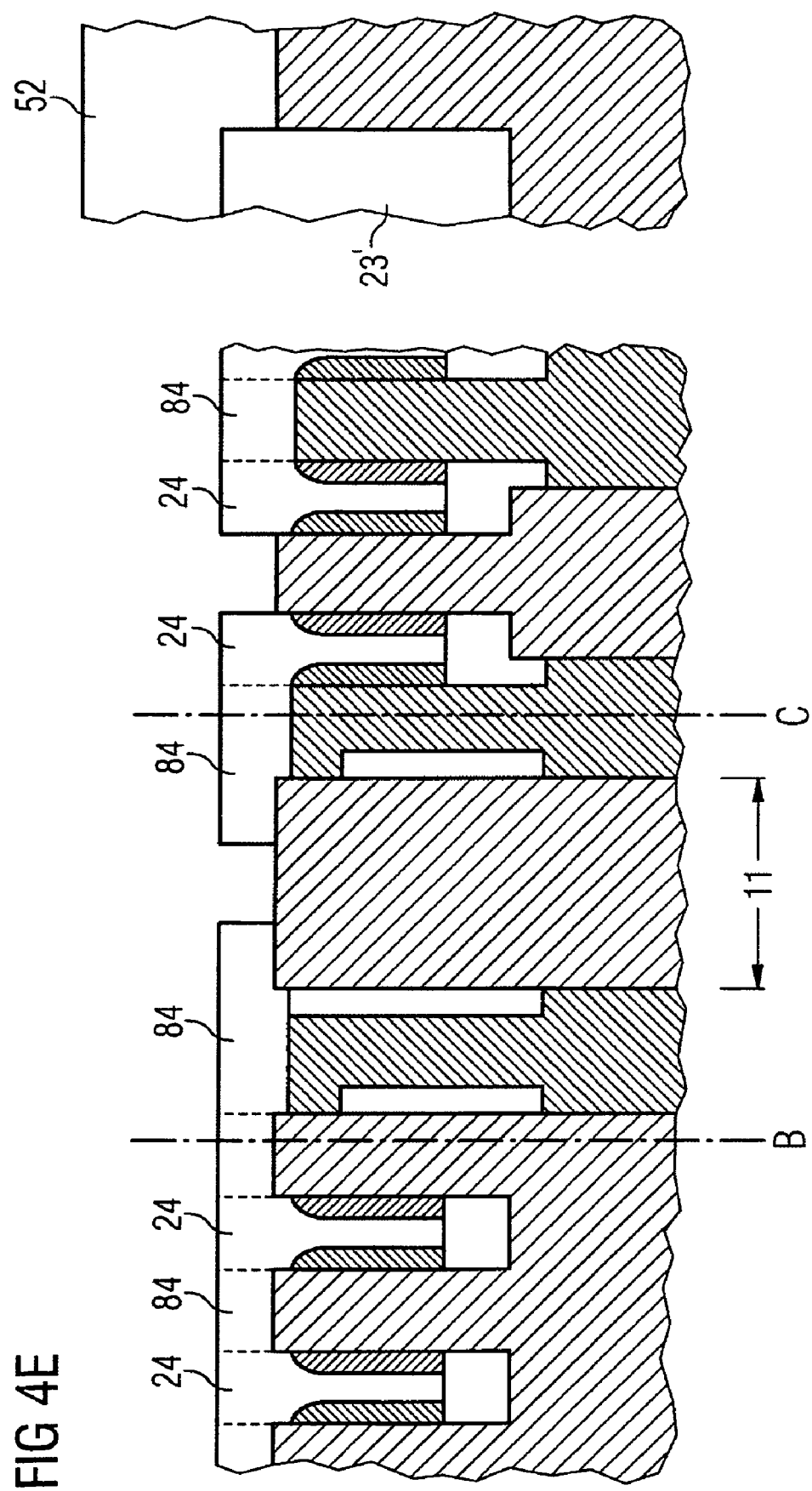

The structure illustrated in FIG. 4E is produced. The protective layer 51 or 511 has been completely removed. Instead, a patterned auxiliary oxide layer 84 rests in the region of the memory cell array 91. The openings of the auxiliary oxide layer 84 corresponds to the residual sections 511 of the protective layer 51 that have been caused to recede. The auxiliary layer 84 forms a mask for the subsequent etching process for forming the recess trenches 18. The mask is self-aligned with respect to the hole trench capacitors 8. The logic region 92 is covered by a blocking mask 52.

Recess trenches 18 are introduced into the semiconductor substrate 1 through the openings of the auxiliary oxide layer 84.

The etching process for forming the recess trenches 18 is effected selectively with respect to the silicon oxide of the auxiliary oxide layer 84 and furthermore selectively with respect to the photoresist material of the blocking mask 52.

FIG. 4F illustrates the recess trenches 18 introduced into the semiconductor substrate 1 in the region of the active zones 11. Within the active zone 11, a first source/drain region 12 connected to the storage electrode 61 of the assigned hole trench capacitor 8 is separated from a second source/drain region 13 by the recess trench 18.

The blocking mask 52 is removed and the sections of the active zones 11 that are freed by the recess trenches 18 are oxidized. A conformal silicon nitride layer is deposited and the recess trenches 18 are filled in the process. The conformally deposited silicon nitride layer is caused to recede as far as the upper edge of the auxiliary oxide layer 84.

Figure 4G:
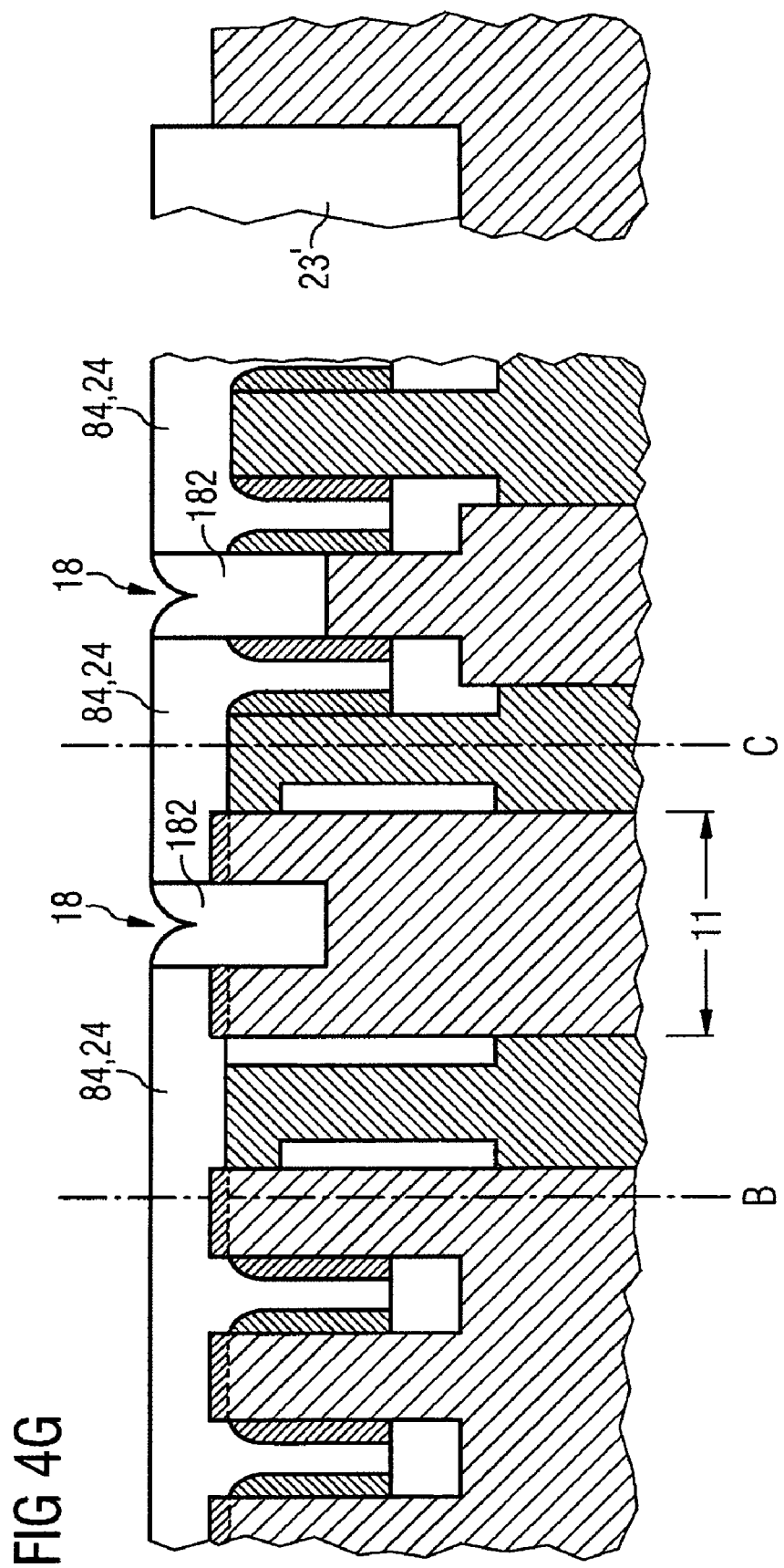

In accordance with FIG. 4G, the recess trenches 18 are filled with a silicon nitride filling structure 182. The deposition of the silicon nitride layer and also the process of causing it to recede are controlled such that the silicon nitride layer is completely removed in the logic region 92.

The logic region 92 is processed, logic transistor structures having logic gate structures 53 and logic source/drain regions 54 being formed. After the formation of the logic gate structures 53, a dielectric material is applied, which insulates the logic gate structures 53 from one another and is provided as an interlayer dielectric 41 in the region of the memory cell array 91.

Figure 4H:
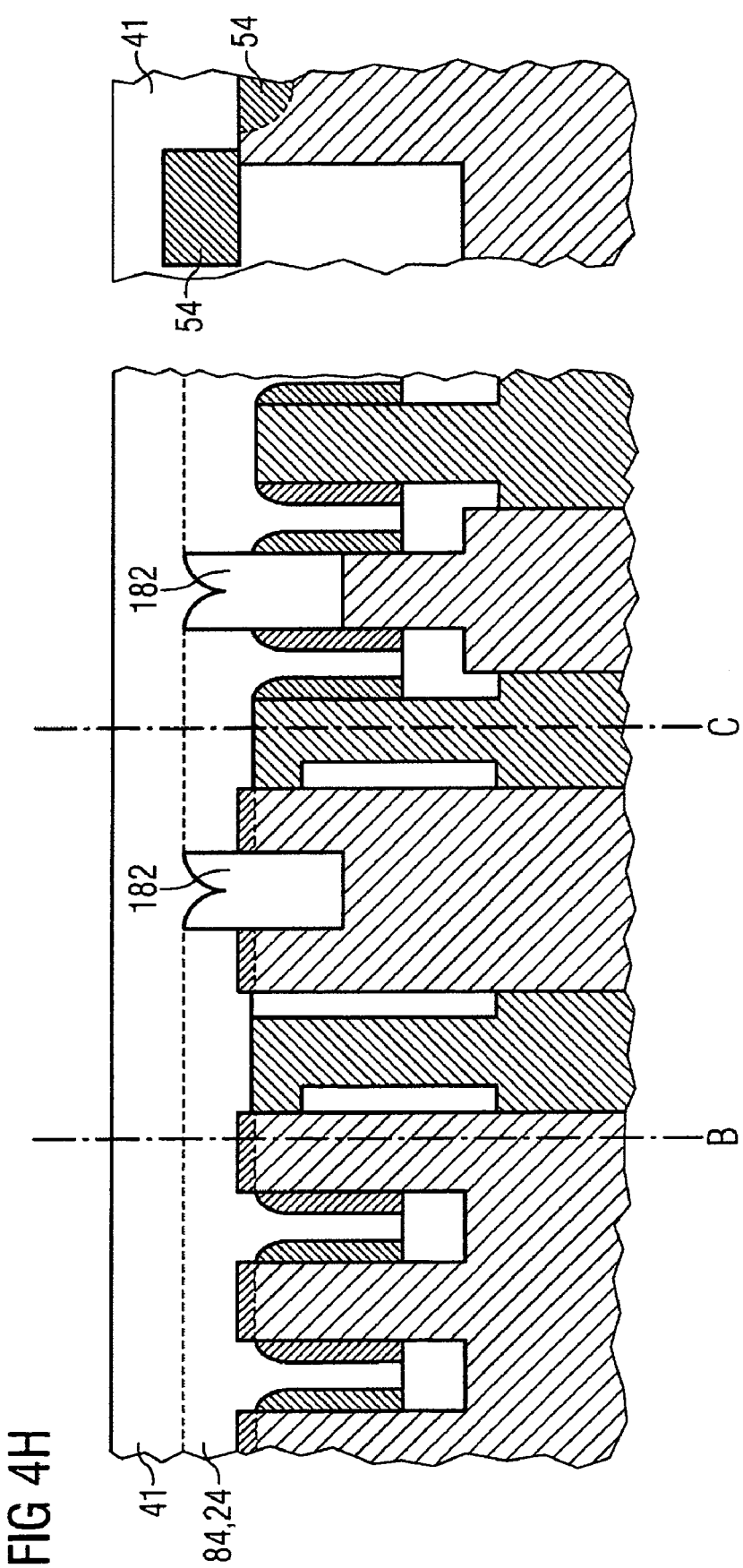
Figure 41:
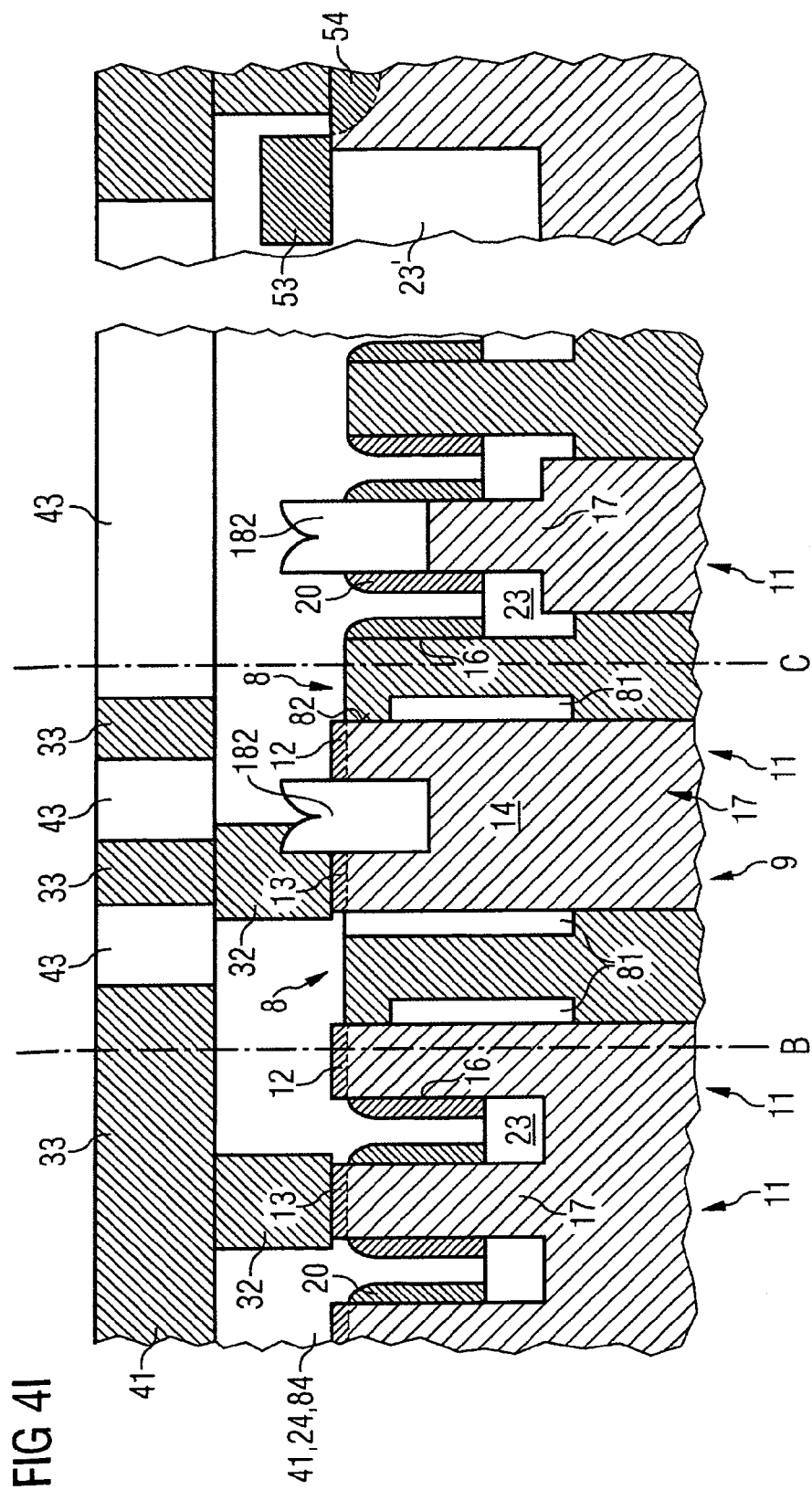

The structures covered by the interlayer dielectric 41 in the memory cell array 91 and also in the logic region 92 are illustrated in FIG. 4H.

By a photolithographic method, openings are provided in the interlayer dielectric 41 as far as the substrate surface 10 in the region of the second source/drain regions 13. The openings are filled with a conductive material, for instance tungsten. After the filling material has been caused to recede as far as the upper edge of the interlayer dielectric 41, the conductive material forms bit line contacts 32 that adjoin the semiconductor substrate 1 in the region of the second source/drain regions 13. A layer made of a conductive material is applied and data lines 33 are patterned from the layer made of the conductive material by a photolithographic method. An intermediate data line dielectric 43 is provided between the data lines 33.

In accordance with FIG. 4I, the method yields a DRAM having a memory cell array 91 and a logic region 92. The memory cell array 91 comprises memory cells having in each case a selection transistor 9 and a hole trench capacitor 8. The active zone 11 of the selection transistor 9 is formed in a fin 17 of the semiconductor substrate 1.

Within a cell row, the fin 17 is delimited by in each case two adjacent hole trench capacitors 8. Toward adjacent cell rows, the fin 17 is delimited by word line trenches 20 running parallel. A gate dielectric 16 is formed along the sidewalls of the fins 17 oriented toward the word line trenches 20.

Furthermore, provision is made of gate electrodes that are arranged along the fins 17 in the word line trenches 20, said gate electrodes being formed in the manner of sidewall spacer structures 21. The sidewall spacer structures 21 are seated on bottom insulator structures 23 in the word line trenches 20. In the upper section, the hole trench capacitors 8 are lined by a collar insulator structure 81, which insulates a storage electrode 61 arranged in the interior of a hole trench from the semiconductor substrate 1 adjoining the upper section of the hole trench and from the structures formed there. The collar insulator structure 81 is caused to recede on the side facing the active zone 11 of the assigned selection transistor, with the result that the storage electrode 61 electrically conductively adjoins the first source/drain region 12 of the assigned selection transistor in the region of a contact window 82.

A second source/drain region 13 of the selection transistor adjoins the collar insulator structure 81 of the hole trench capacitor 8 of the adjacent memory cell. A recess trench 18 is introduced between the two source/drain regions 12, 13 and is filled with a silicon nitride filling 182. The second source/drain region 13 adjoins a bit line contact 32 which rests on the substrate surface 10 and via which the second source/drain region 13 is connected to a data line 33 provided above the bit line contacts.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Semiconductor substrate
10 Substrate surface
11 Active zone
12 First source/drain region
13 Second source/drain region
14 Body region
15 Channel
16 Gate dielectric
17 Fin
18 Recess trench
181 Filling of recess trench
182 Filling of recess trench
2 Gate electrode
2a Highly conductive section
20 Word line trench
20a Gate electrode trench
21 Sidewall spacer structure
23 Bottom insulator structure
23' Shallow insulator structure
24 Word line insulator structure
31 Bit contact
32 Bit line contact
33 Data line
33' Date line
35 Capacitor connection structure
36 Node pad
41 Interlayer dielectric
42 Data line dielectric
43 Intermediate data line dielectric
44 Intermediate capacitor dielectric
51 Protective layer
511 Protective layer caused to recede
52 Blocking mask
53 Logic gate structure
54 Logic source/drain region
6 Storage capacitor
61 Storage electrode
62 Capacitor dielectric
63 Counterelectrode
64 Cell insulator trench
7 Stacked capacitor
71 Auxiliary layer 72 Hard mask
73 Silicon nitride protective coating
8 Hole trench capacitor
80 Hole trench recess
81 Collar insulator structure
82 Contact window
84 Auxiliary oxide layer
9 Selection transistor
91 Cell array
92 Logic region
93 Logic transistor structure
94 Intergate dielectric fill
95 Gate stack insulator structure
96 Cell current
97 Memory cell
98 Transistor structure

What is claimed is:

1. A transistor structure, comprising:
a semiconductor substrate having a top surface and sidewalls extending downward from the top surface;
two source/drain regions formed into the top surface of the semiconductor substrate;
a recess structure formed into the top surface of the semiconductor substrate between the two source/drain regions and extending further into the semiconductor substrate than the two source/drain regions such that a lower edge of the recess structure is below lower edges of the two source/drain regions;
an active zone comprising the two source/drain regions and a body region in the semiconductor substrate lying below the first and second source/drain regions and the recess structure; and
a gate electrode including at least a first section arranged along a first of the sidewalls of the semiconductor substrate at least between the two source/drain regions, the first section of the gate electrode extending downward from the lower edges of the two source/drain regions to beyond the lower edge of the recess structure, wherein the body region provides a conductive channel between the two source/drain regions, which is controllable by a potential at the gate electrode.

2. The transistor structure as claimed in claim 1, wherein the gate electrode includes a second section arranged along a second of the sidewalls of the semiconductor substrate opposite to the first sidewall along which the first section of the gate electrode is arranged, such that at least a portion of the recess structure lies between the first and section sections of the gate electrode.

3. The transistor structure as claimed in claim 2, wherein the active zone is surrounded by the first and second sections of the gate electrode along the first and second sidewalls.

4. The transistor structure as claimed in claim 2, wherein the active zone is formed in a fin of the semiconductor substrate that is provided between two parallel gate electrode trenches, and the gate electrode is provided in the gate electrode trenches in a manner spaced apart from the active zone by a gate dielectric.

5. A memory cell, comprising:
a storage capacitor for storing electrical charge and including a storage electrode; and
a selection transistor comprising the transistor structure of claim 1 connected in series with the storage capacitor by a source/drain path, wherein one of the source/drain regions is connected to the storage electrode, the other of the source/drain regions is connected to a data line for supplying and conducting away electrical charge, and the gate electrode is connected to an addressing line for the control of the memory cell, an effective channel length $L_{eff}$ of the selection transistor being determined by the depth of the recess structure between the source/drain regions.

6. A method for fabricating selection transistors for DRAMs having a memory cell array having memory cells according to claim 5 and having hole trench capacitors as storage capacitors, the method comprising:
providing a protective layer on the semiconductor substrate;
forming the hole trench capacitors arranged in cell rows, each hole trench capacitor including a storage electrode formed by filling a hole trench with a conductive material;
causing the storage electrodes of the hole trench capacitors to recede to below the lower edge of the protective layer; and
causing the protective layer to recede isotropically, so that residual sections of the protective layer that have been caused to recede remain in a self-aligned manner between two hole trench capacitors that are adjacent in a cell row, and the residual sections of the protective layer that have been caused to recede form a mask for the implantation of source/drain regions to be provided in the semiconductor substrate and/or a precursor mask for forming recess trenches.

7. The method as claimed in claim 6, wherein, after causing the protective layer to recede isotropically, an auxiliary oxide layer is applied, the auxiliary oxide layer is caused to recede as far as the upper edge of the residual sections of the protective layer, and a self aligned mask for the introduction of recess trenches is produced by removing the residual sections of the protective layer.

8. The method as claimed in claim 7, wherein a section of a gate electrode of each selection transistor is provided in the recess trenches.

9. A memory cell array, comprising:
a plurality of memory cells arranged in cell rows and cell columns, each memory cell including:
a storage capacitor for storing electrical charge and including a storage electrode; and
a selection transistor comprising the transistor structure of claim 1 connected in series with the storage capacitor by a source/drain path, wherein one of the source/drain regions is connected to the storage electrode, the other of the source/drain regions is connected to a data line for transferring the electrical charge; and the gate electrode is connected to an addressing line for the control of the memory cell, an effective channel length $L_{eff}$ of the selection transistor being determined by the depth of the recess structure between the source/drain regions, wherein gate electrodes of selection transistors of memory cells respectively arranged in a cell row are formed in a manner adjoining one another and addressing lines are formed by the gate electrodes connected to one another.

10. The memory cell array as claimed in claim 9, wherein the storage capacitors and the selection transistors are arranged in the manner of a chessboard pattern, the selection transistors each being assigned to first arrays that are diagonally adjacent to one another and the storage capacitors each being assigned to second arrays that are situated in between and are diagonally adjacent.

11. The memory cell array as claimed in claim 10, wherein the storage capacitors are formed as hole trench capacitors oriented at a respective hole trench introduced into the semiconductor substrate.

12. The memory cell array as claimed in claim 11, wherein:
the active zones are separated from one another within a cell row by the hole trench capacitors and the cell rows are separated from one another by word line trenches;
the recess trenches are provided perpendicular to the word line trenches and equidistantly from the two respectively adjacent hole trench capacitors;
the addressing lines are arranged in the word line trenches, and the data lines are led above the substrate surface perpendicular to the word line trenches, the recess structures being arranged between the data lines.

13. The memory cell array as claimed in claim 11, wherein the recess structures are made of silicon nitride.

14. A method for fabricating a DRAM having a memory cell array as claimed in claim 11 and a logic region, the method comprising:
providing a protective layer on the semiconductor substrate;
forming the hole trench capacitors in the semiconductor substrate;
introducing parallel word line trenches into the semiconductor substrate;
arranging the gate electrodes at the sidewalls of the word line trenches, gate electrodes arranged at mutually opposite sidewalls of the word line trenches being provided in a manner insulated from one another;
filling the word line trenches with a word line insulator structure;
causing the storage electrodes of the hole trench capacitors to recede;
causing the protective layer to recede isotropically, so that residual sections of the protective layer that have been caused to recede remain effecting complete coverage in the logic region and in the memory cell array over those regions which are provided for forming recess trenches;
applying an auxiliary oxide layer;
causing the auxiliary oxide layer to recede as far as the upper edge of the residual sections of the protective layer;
removing the residual sections of the protective layer;
introducing the recess trenches using the auxiliary oxide layer as a mask; and
producing the recess structures by covering or filling the recess trenches with a dielectric material.

15. The method as claimed in claim 14, wherein, after introducing the word line trenches, the word line trenches and shallow insulator trenches in the logic region are filled with a dielectric material, the logic region is covered with a temporary blocking mask, and the dielectric material is caused to recede in the memory cell array, so that bottom insulator structures are formed from the dielectric material in lower sections of the word line trenches.

16. The method as claimed in claim 14, wherein the source/drain regions are formed after the protective layer has been caused to recede, an implantation mask being formed by the residual sections of the protective layer.

17. The method as claimed in claim 14, wherein filling the recess trenches comprises:
oxidizing the sidewalls of the recess trenches;
depositing a conformal nitride liner; and
causing the conformal nitride liner to recede to below the upper edge of the auxiliary oxide layer, so that a filling of the recess trenches emerges from the nitride liner.

18. The method as claimed in claim 14, wherein, prior to introducing the recess trenches, the logic region is covered with a blocking mask made of a photoresist material.

19. The memory cell array as claimed in claim 9, wherein the storage capacitors are formed as stacked capacitors above a substrate surface of the semiconductor substrate.

20. The memory cell array as claimed in claim 19, wherein:
the active zones are formed with a rectangular surface contour and are each separated from one another within a cell row by cell insulator trenches;
the cell rows are separated from one another by word line trenches that are wider than the cell insulator trenches;
the recess structures are provided parallel to the cell insulator trenches, each recess structure being equidistant from two adjacent cell insulator trenches;
the addressing lines are provided in the word line trenches; and
the data lines are led over the substrate surface above the recess structures and the cell insulator trenches.

21. The memory cell array as claimed in claim 20, wherein the cell insulator trenches and the word line trenches have the same depth.

22. The memory cell array as claimed in claim 20, wherein the width of the cell insulator trenches is less than twice the layer thickness of the addressing lines, and the width of the word line trenches is greater than twice the layer thickness of the addressing lines.

23. The memory cell array as claimed in claim 20, wherein the recess structures are made of silicon oxide.

24. A method for fabricating a DRAM having a memory cell array as claimed in claim 19 and a logic region, the method comprising:
providing a protective layer on the semiconductor substrate;
introducing word line trenches and cell insulator trenches perpendicular to the word line trenches into the semiconductor substrate, the cell insulator trenches being narrower than the word line trenches;
arranging the gate electrodes at sidewalls of the word line trenches and the cell insulator trenches, gate electrodes provided at mutually opposite sidewalls of the word line trenches being insulated from one another and gate electrodes arranged at mutually opposite sidewalls of the cell insulator trenches being connected to one another;
filling the word line trenches and the cell insulator trenches with a word line insulator structure;
removing the protective layer in the memory cell array;
applying an auxiliary layer made of conductive semiconductor material;
causing the auxiliary layer to recede as far as the upper edge of the word line insulator structure;
introducing recess trenches between cell insulator trenches; and
producing the recess structures by covering or filling the recess trenches with a dielectric material.

25. The method as claimed in claim 24, further comprising:
filling the word line trenches, the cell array insulator trenches and shallow insulator trenches in the logic region with a dielectric material;
covering the logic region including the shallow insulator structures with a blocking mask; and
causing the dielectric material to recede in the memory cell array, whereby bottom insulator structures are formed in lower sections of the word line trenches and of the cell insulator trenches.

26. The method as claimed in claim 24, wherein the recess trenches are introduced by a hard mask made of silicon oxide being applied to the auxiliary layer and patterned photolithographically, and the recess trenches are introduced by an etching process that acts selectively with respect to silicon oxide.

27. The method as claimed in claim 24, wherein the processing of the logic region comprises:

removing the protective layer in the logic region;

applying a silicon nitride protective coating;

removing the silicon nitride protective coating in the logic region; and forming logic transistor structures in the logic region.

* * * * *